United States Patent
John et al.

(10) Patent No.: US 11,016,261 B2
(45) Date of Patent: May 25, 2021

(54) ACTUATOR WITH SHAPE-MEMORY ELEMENT

(71) Applicant: Carl Zeiss Microscopy GmbH, Jena (DE)

(72) Inventors: Benjamin John, Jena (DE); Michael Schulz, Tonna (DE)

(73) Assignee: CARL ZEISS MICROSCOPY GMBH, Jena (DE)

( * ) Notice: Subject to any disclaimer, the term of this patent is extended or adjusted under 35 U.S.C. 154(b) by 126 days.

(21) Appl. No.: 16/334,910

(22) PCT Filed: Sep. 27, 2017

(86) PCT No.: PCT/EP2017/074460
§ 371 (c)(1),
(2) Date: Mar. 20, 2019

(87) PCT Pub. No.: WO2018/060229
PCT Pub. Date: Apr. 5, 2018

(65) Prior Publication Data
US 2019/0285829 A1 Sep. 19, 2019

(30) Foreign Application Priority Data
Sep. 30, 2016 (DE) ............ 10 2016 219 054.7

(51) Int. Cl.
*G03B 5/02* (2021.01)
*G02B 7/02* (2021.01)
(Continued)

(52) U.S. Cl.
CPC ............ *G02B 7/023* (2013.01); *F03G 7/06* (2013.01); *F03G 7/065* (2013.01); *G02B 7/003* (2013.01);
(Continued)

(58) Field of Classification Search
CPC ........ A61B 17/12022; A61B 17/12113; A61B 17/12145; A61B 17/1215; A61B 17/221;
(Continued)

(56) References Cited

U.S. PATENT DOCUMENTS 7,294,102 B2   11/2007   Jones et al.
7,591,834 B2   9/2009    Buckley et al.
(Continued)

FOREIGN PATENT DOCUMENTS

DE   10 2004 018 110   11/2004
DE   601 15 272 T2     8/2006
(Continued)

OTHER PUBLICATIONS

International Search Report dated Jan. 18, 2018 in PCT/EP2017/074460 with English translation.
(Continued)

*Primary Examiner* — Brandi N Thomas
(74) *Attorney, Agent, or Firm* — Grüneberg and Myers PLLC

(57) ABSTRACT

An actuator for adjusting an element to be moved in a beam path of an optical arrangement contains the element to be moved, a carrier and at least one SM element, the SM element being connected to the element to be moved and designed such that it is supported on the carrier, so that when the dimension of the SM element changes, a directed force effect is produced between the element to be moved and the carrier.

20 Claims, 18 Drawing Sheets

(51) Int. Cl.
*F03G 7/06* (2006.01)
*H01L 41/12* (2006.01)
*G03B 3/10* (2021.01)
*G02B 7/00* (2021.01)
*G02B 7/08* (2021.01)
*G03B 3/12* (2021.01)

(52) U.S. Cl.
CPC ............ *G02B 7/021* (2013.01); *G02B 7/08* (2013.01); *G03B 3/10* (2013.01); *G03B 5/02* (2013.01); *H01L 41/12* (2013.01); *G03B 3/12* (2013.01); *G03B 2205/0076* (2013.01)

(58) Field of Classification Search
CPC ... A61B 1/00096; A61B 1/00188; A61B 1/31; A61B 2017/00398; A61B 2017/00867; A61B 2017/00871; A61B 2017/00876; A61B 2017/1205; A61B 2090/3954; A61B 5/0068; A61F 2002/30092; A61F 2210/0033; A61F 2210/0047; A61F 2210/0052; A61F 2/01
USPC .................... 359/811, 813, 815, 819–824
See application file for complete search history.

(56) References Cited

U.S. PATENT DOCUMENTS

| | | |
|---|---|---|
| 8,441,749 B2 | 5/2013 | Brown et al. |
| 8,901,786 B2 | 12/2014 | Laufenberg et al. |
| 9,267,494 B2 | 2/2016 | Suissa et al. |
| 9,696,518 B2 | 7/2017 | Hembacher |
| 2002/0048057 A1 | 4/2002 | Binnig et al. |
| 2004/0220453 A1 | 11/2004 | Jones et al. |
| 2005/0212630 A1 | 9/2005 | Buckley et al. |
| 2011/0057751 A1* | 3/2011 | Feil .................. H01H 71/2454 335/205 |
| 2011/0279916 A1 | 11/2011 | Brown et al. |
| 2013/0002057 A1 | 1/2013 | Laufenberg et al. |
| 2013/0205770 A1* | 8/2013 | Browne ................ F03G 7/065 60/527 |
| 2013/0242282 A1 | 9/2013 | Hembacher |
| 2014/0130492 A1* | 5/2014 | Suissa ................... F03G 7/06 60/527 |
| 2015/0296602 A1* | 10/2015 | Loopstra ............... H05G 2/006 250/493.1 |

FOREIGN PATENT DOCUMENTS

| | | |
|---|---|---|
| DE | 10 2010 010 801 | 9/2011 |
| DE | 9696518 | 6/2013 |
| DE | 10 2012 219 591 | 4/2014 |
| DE | 10 2014 215 159 | 9/2014 |
| EP | 1 298 478 | 4/2003 |
| EP | 2 140 138 | 4/2012 |
| JP | H06-313833 | 11/1994 |
| JP | 2006-91410 | 4/2006 |
| WO | 2007/113478 | 10/2007 |
| WO | 2009/135500 | 11/2009 |
| WO | 2013/121225 | 8/2013 |
| WO | 2014/076463 | 5/2014 |
| WO | 2016/048546 | 3/2016 |

OTHER PUBLICATIONS

Written Opinion dated Jan. 18, 2018 in PCT/EP2017/074460.
International Preliminary Report on Patentability dated Apr. 2, 2019 in PCT/EP2017/074460.
English translation of Written Opinion dated Jan. 18, 2018 in PCT/EP2017/074460.

* cited by examiner

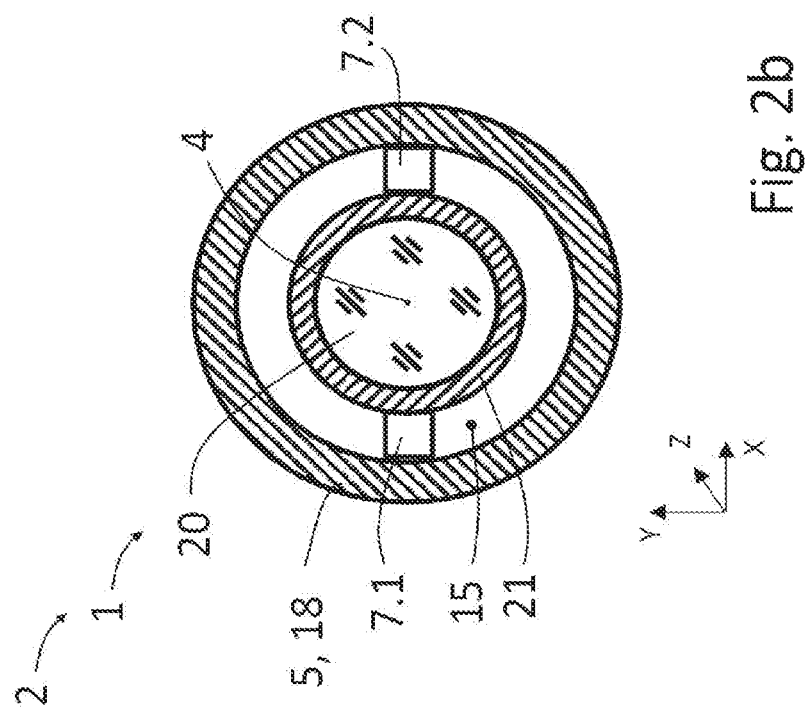
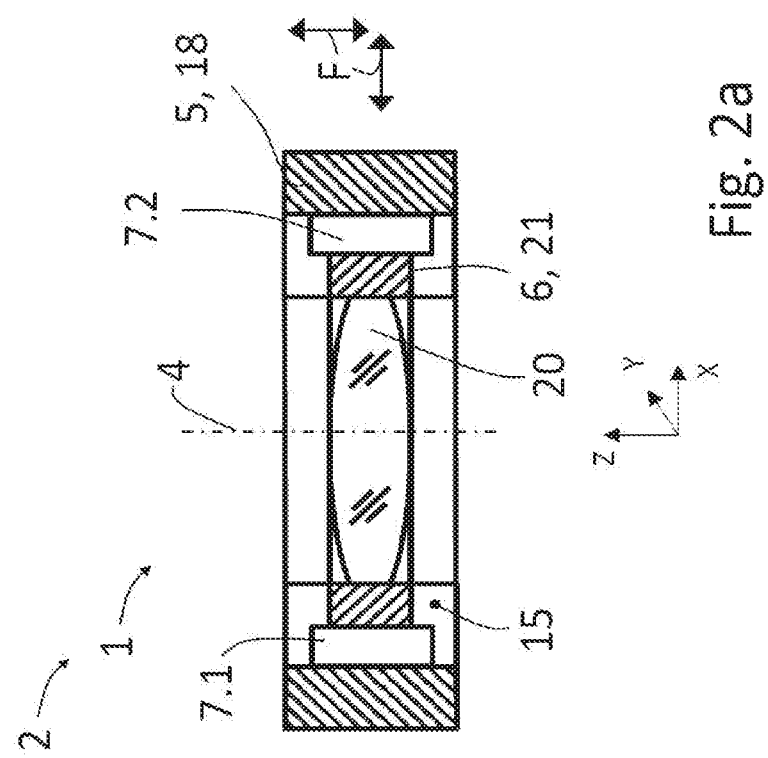

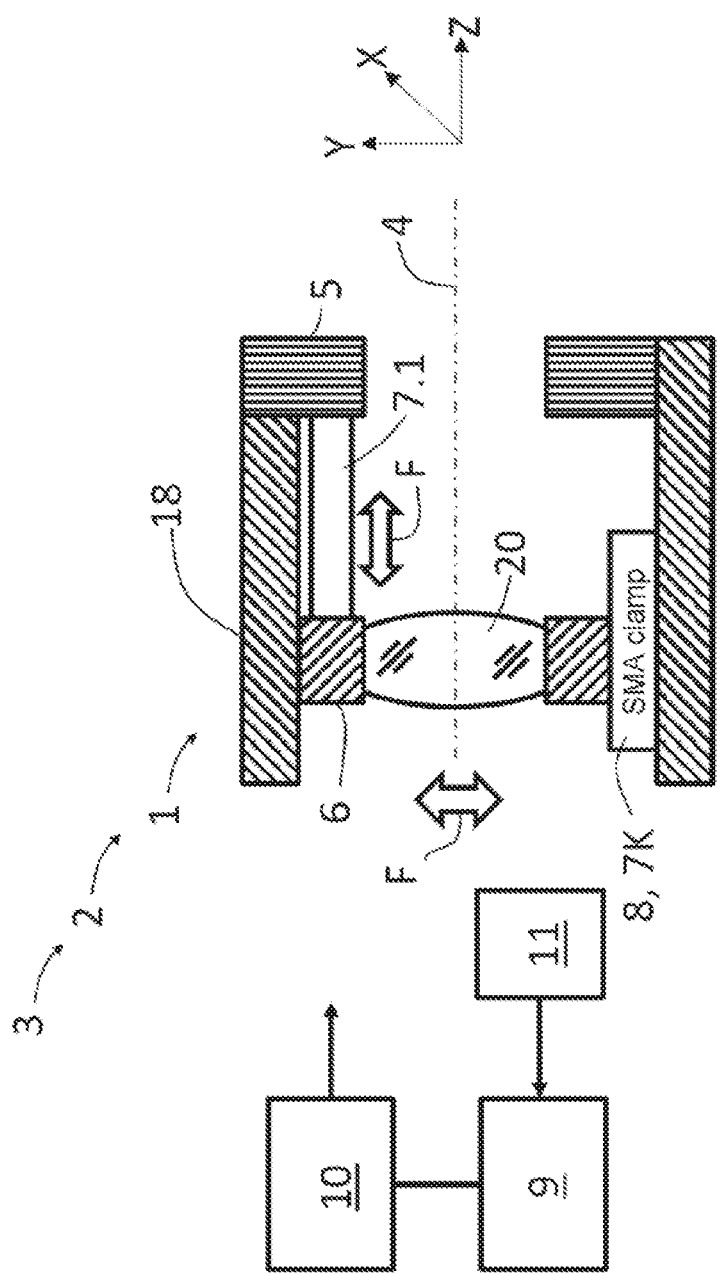

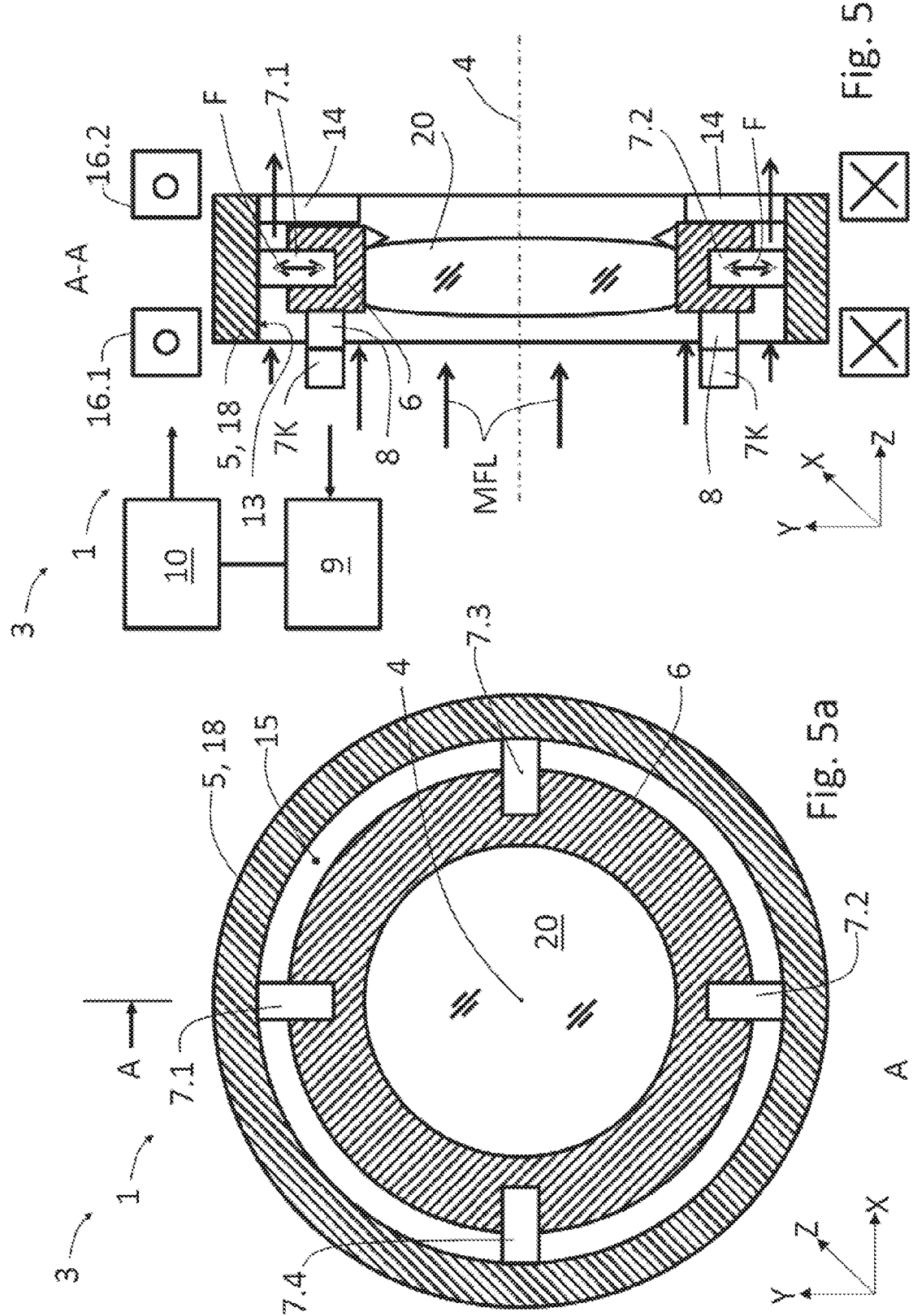

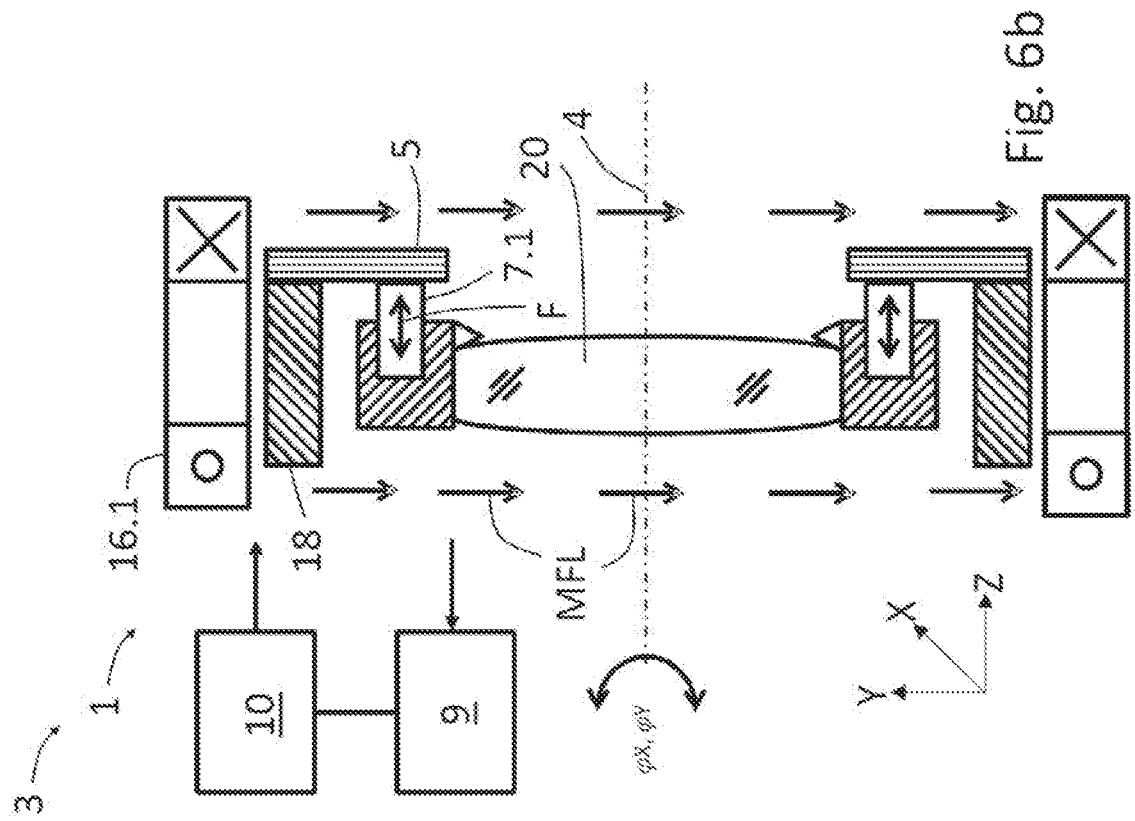
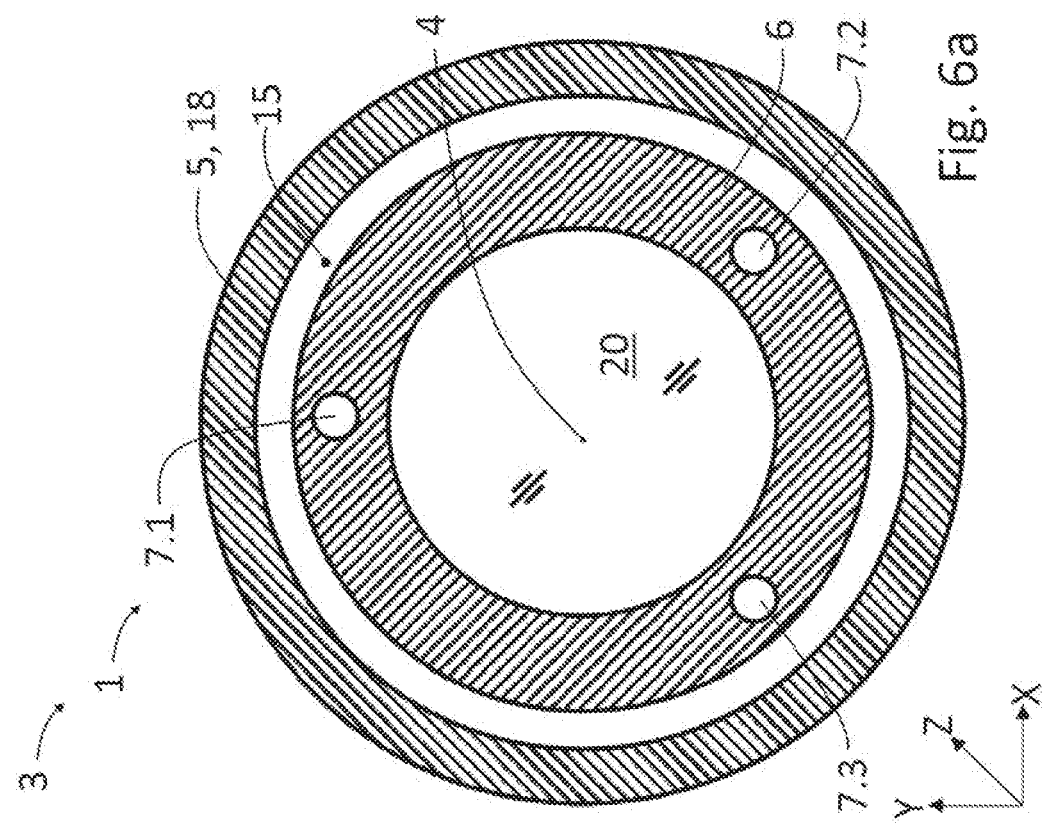

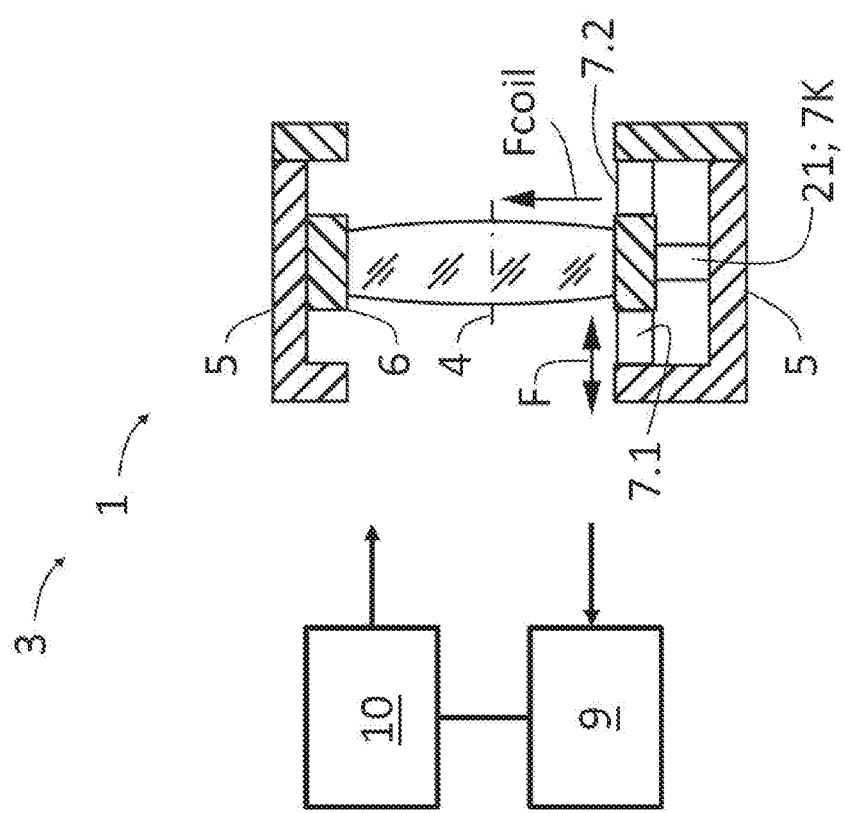

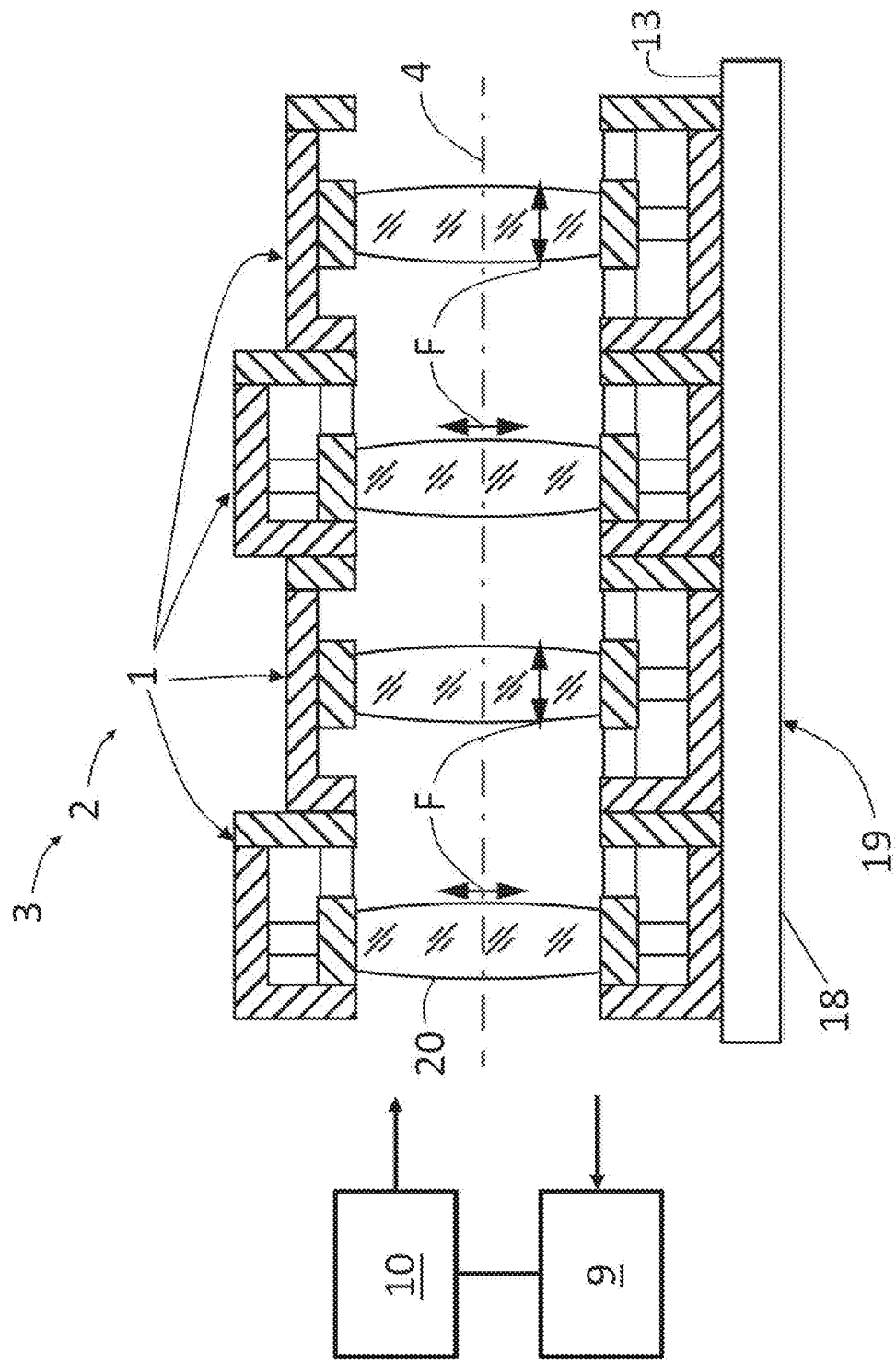

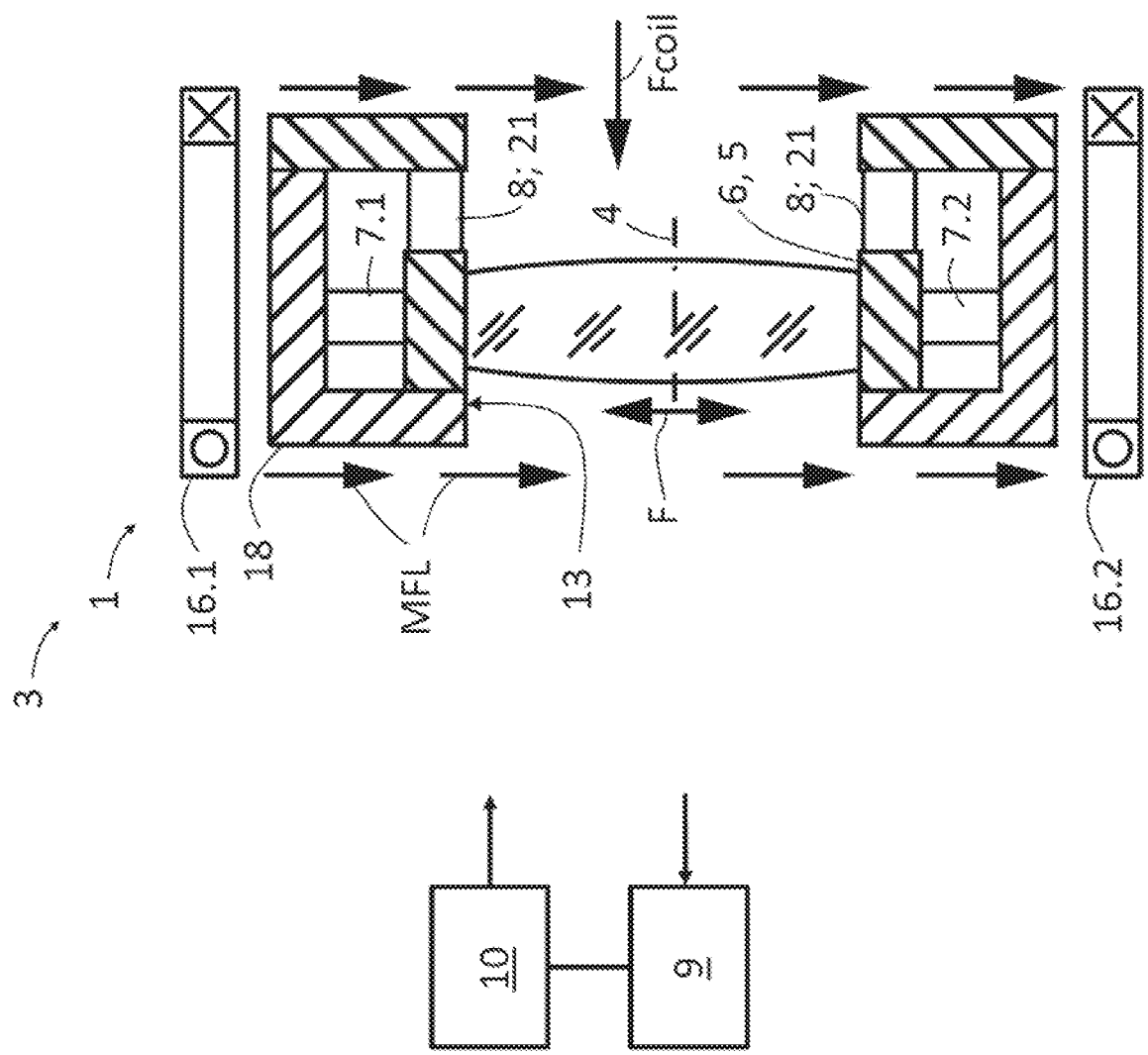

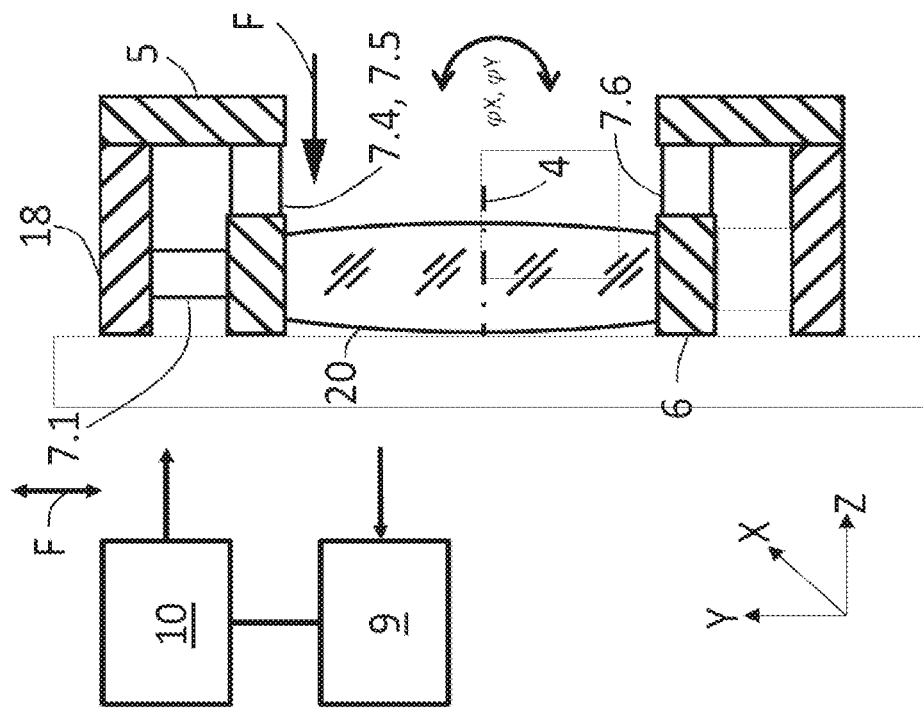
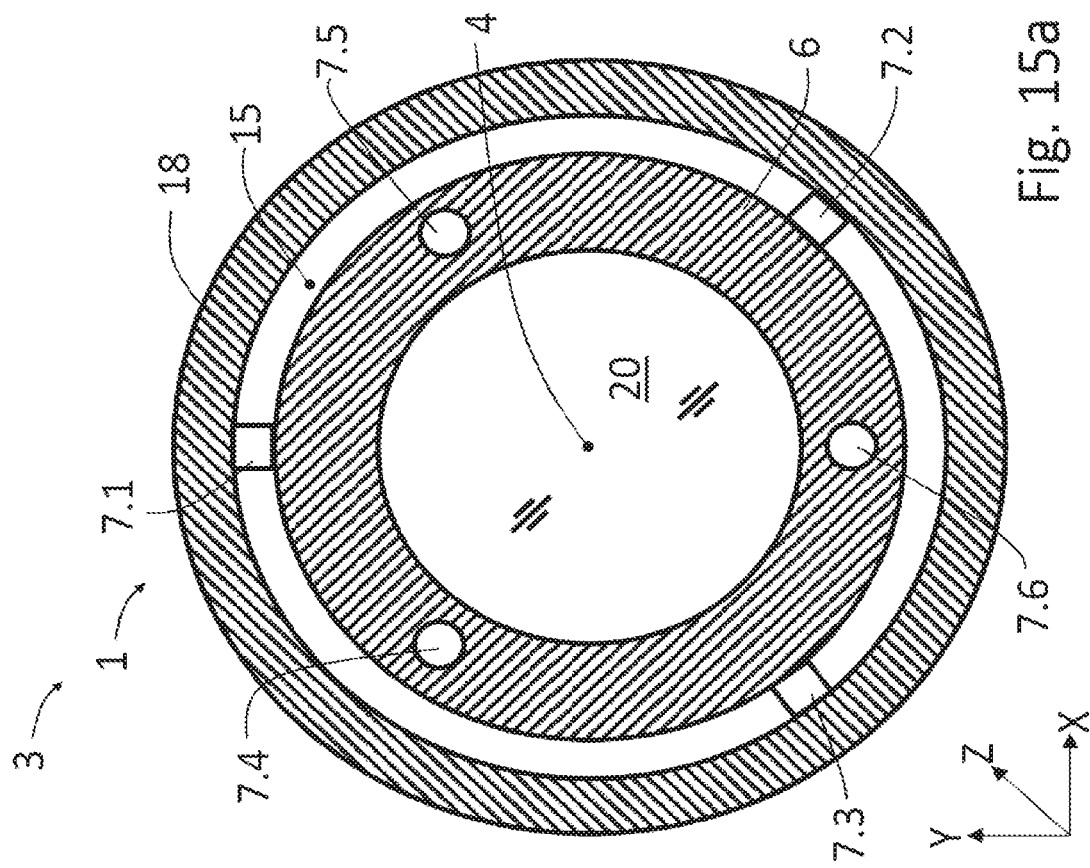

ACTUATOR WITH SHAPE-MEMORY ELEMENT

This application is a National Stage entry under § 371 of international Application No. PCT/EP2017/074460, filed on Sep. 27, 2017, and which claims the benefit of German Application No. 10 2016 219 054.7, Sep. 30, 2016.

BACKGROUND OF THE INVENTION

Field of the Invention

The invention relates to an actuator with a shape-memory element and apparatuses for adjusting an element to be moved along a displacement path. Furthermore, the invention relates to arrangements and apparatuses with an actuator, and uses of the actuator.

Description of the Related Art

The use of motors and piezo-drives, for example, for adjusting elements to be moved, in particular in optical arrangements, is known. These may also be used to carry out movements in a (partly) automated optical arrangement such as a microscope. Thus, for example, the focus can be modified, or filters can be changed.

The ability of certain alloys (shape-memory alloys, SMAs) to readopt their original form after heating has been known for some time. The forces arising in the process are suitable for positioning movable elements in targeted fashion.

A first approach was already described in EP 2 140 138 B1 and implemented for producing a movement in a camera phone. EP 2 140 138 B1 has disclosed a control system for an SMA actuating apparatus, in particular. The SMA actuating apparatus has an SMA actuator which causes the movement of a movable component in the case of a contraction on account of thermal effects. The control system comprises a current source. The SMA actuator is heated by electric current flowing through the SMA actuator. Further, a detector circuit for detecting the electrical resistance of the SMA actuator and a controller for controlling the current source are present. The SMA actuator is heated by means of the controller while the electrical resistance of the SMA actuator is monitored. A position of a movable component is captured and, depending on the position, the SMA actuator is heated further or cooled in order to set the position of the movable component. Accurate positioning of the actuator is possible by the opposed arrangement of the wires made of a shape-memory alloy. At the same time, the current position can be deduced by a resistance measurement of the employed wires.

U.S. Pat. No. 8,441,749 B2 has described an actuator that is based on shape-memory alloys (SMAs). The former comprises a carrier, an element to be moved and a holding apparatus with a multiplicity of elastic connection elements between carrier and element to be moved. The element to be moved is guided along an axis as a result of the effect of the holding apparatus. When its length is changed, at least one SMA element in the form of a wire exerts a force on the element to be moved.

WO 2013/121225 A1 has disclosed an actuator comprising four SMA elements in the form of wires, a carrier and an element to be moved. In the case of each SMA element, one end is connected to the carrier and the other end is connected to the element to be moved. The force effects produced by the SMA elements are directed counter to one another. The element to be moved is positionable in an XY-plane by way of a targeted change in the lengths of the SMA elements.

WO 2007/113478 relates to an actuator for moving a camera lens. The actuator comprises a carrier, the camera lens, a holding apparatus for guiding the movement of the camera lens along its optical axis and at least one pair of SMA elements. The latter are arranged under tensile stress between the camera lens and the carrier.

SUMMARY OF THE INVENTION

The invention is based on the object of proposing further actuators that are improved over the prior art. Furthermore, the invention is based on the object of specifying new apparatuses and uses employing the actuators.

Advantageous developments are the subject matter of the dependent claims.

The objects of the present invention are achieved by the following embodiments:

An actuator for adjusting an element to be moved along a displacement path, said actuator comprising: the element to be moved, a carrier, and at least one first shape-memory element, wherein the first shape-memory element is connected to the element to be moved and embodied so as to be supported on the carrier such that a directed force effect is produced between the element to be moved and the carrier in the case of a change in the extent of the first shape-memory element.

An arrangement, comprising: an actuator as above, a wall delimiting the displacement path at at least one of its sides and a conductor comprising a magnetically conductive material, wherein the conductor, over at least a portion of its length, extends in the wall and the conductor is connected to at least one of the first and/or second SM elements in such a way that magnetic field lines guided in the conductor interact with the first and/or second SM element.

An optical apparatus, comprising: an actuator as above.

An apparatus for adjusting an element to be moved, said apparatus comprising: at least one actuator as above, and an evaluation unit for evaluating current spatial coordinates, and a control unit for generating control commands depending on the evaluated current spatial coordinates.

A method for moving a component of an objective into position, said method comprising: adjusting the position of said component of said objective with an actuator as above.

A method for adjusting a stop, a reflecting element and/or a sensor in a beam path of an optical apparatus, said method comprising: adjusting a position of said stop, said reflecting element and/or said sensor in said beam path of said optical apparatus with an actuator as above.

A method for adjusting at least two optical elements relative to one another, said method comprising: adjusting a position of said at least two optical elements relative to one another with an actuator as above.

BRIEF DESCRIPTION OF THE DRAWINGS

FIG. 2a shows a schematic illustration of a first exemplary embodiment of an actuator according to the invention, in a lateral illustration.

FIG. 2b shows a schematic illustration of the first exemplary embodiment of an actuator according to the invention, in a lateral plan view.

FIG. 3 shows a schematic illustration of a second exemplary embodiment of an actuator according to the invention with a shape-memory element as a clamping element and a first exemplary embodiment of an apparatus for adjusting elements to be moved.

FIG. 5a shows a schematic illustration of a third exemplary embodiment of the actuator according to the invention and of a third exemplary embodiment of the apparatus according to the invention in a plan view.

FIG. 5b shows the schematic illustration of the third exemplary embodiment of the actuator according to the invention and of the third exemplary embodiment of the apparatus according to the invention in a lateral sectional illustration.

FIG. 6a shows a schematic illustration of a fourth exemplary embodiment of the actuator according to the invention and of a fourth exemplary embodiment of the apparatus according to the invention in a plan view.

FIG. 6b shows the schematic illustration of the fourth exemplary embodiment of the actuator according to the invention and of the fourth exemplary embodiment of the apparatus according to the invention in a lateral sectional illustration.

FIG. 12 shows a schematic illustration of a tenth exemplary embodiment of the apparatus according to the invention with actuators according to a ninth exemplary embodiment.

FIG. 13 shows a schematic illustration of an eleventh exemplary embodiment of the apparatus according to the invention with actuators according to the seventh and the ninth exemplary embodiment.

FIG. 14 shows a schematic illustration of a twelfth exemplary embodiment of the apparatus according to the invention with an actuator according to a tenth exemplary embodiment.

FIG. 15a shows a schematic illustration of a twelfth exemplary embodiment of the apparatus according to the invention with an actuator according to a tenth exemplary embodiment in a plan view.

FIG. 15b shows a schematic illustration of the twelfth exemplary embodiment of the apparatus according to the invention with the actuator according to a tenth exemplary embodiment in a side view.

DETAILED DESCRIPTION OF THE INVENTION

Figure 1A:
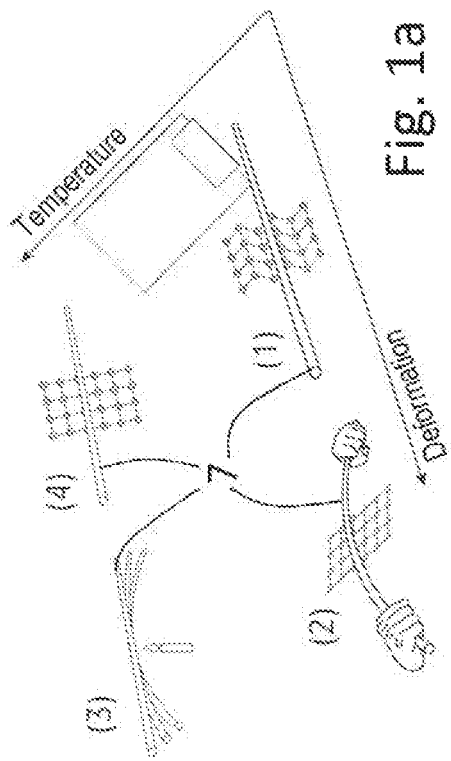
FIG. 1*a* shows a schematic illustration of a shape-memory element made of a memory alloy, and the behavior thereof upon deformation and heating.

In the present description, shape-memory elements, which are also abbreviated SM elements below, are understood to be those elements that substantially consist of a shape-memory material. Shape-memory materials can be shape-memory alloys (smart metal alloy; usable for shape-memory actuators, for example), shape-memory polymers (SMPs), magnetic shape-memory materials (MSM, magnetic shape-memory alloy; usable for magnetic shape-memory actuators, for example; magnetic shape-memory actuators), dielectric elastomers (usable for dielectric elastomer actuators, DEA) and the combinations thereof. Further, shape-memory materials can be materials as described in U.S. Pat. No. 7,591,834 B2.

Magnetic shape-memory alloys can be considered to be a subgroup of shape-memory alloys. In these materials, the shape-memory effect is predominantly caused by the effect of correspondingly aligned and strong magnetic fields. Here, depending on the respective shape-memory material, changes of up to 10% are possible in at least one of the dimensions of the magnetic shape-memory material, for example in the length thereof. SM elements on the basis of magnetic shape-memory materials have a great self-retention effect. The self-retention effect renders it possible to keep an optical element, for example, in its position even without an additional clamping element. On account of the self-retention effect, an SM element or at least some of the elements or components having a working relationship with said SM element remain(s) in their (its) position, even if an external force should act.

Very high demands are placed on the adjustment of optical systems, in particular, in order to ensure an unchanging high imaging quality. At the same time, manufacturing costs should be reduced, for example by using those technical solutions in which the required tolerances need not be chosen to be too small.

Previously, adjustments of elements to be moved were realized with the aid of adjustment rings or manual actuating elements (e.g., set screws). In so doing, the system to be adjusted must, within the scope of an adjustment by means of adjustment rings, be assembled, measured and subsequently disassembled again. This procedure requires much time and harbors the risk of modifying the properties of the system in the case of a renewed assembly thereof. Moreover, evaluating a current state of the adjustment in real time is not possible.

If the adjustment is carried out by means of manual actuating elements, the sensitivity of the adjustment is limited by the thread, for example. Moreover, accesses to the individual actuating elements are required, as a result of which the structural embodiment options are greatly restricted. Not least, additional installation space is required for the adjustment elements.

The use of SM elements and actuators comprising SM elements facilitates the space-saving and cost-effective integration thereof, for example in optical apparatuses. The achievable positioning accuracies are within one micrometer, and so the adjustment can be carried out with high sensitivity. Further, the adjustment can be accompanied in visual fashion and, for example, in real time (live observation).

What is moreover advantageous is that the manufacturing tolerances to be observed can be large (e.g., a loose fit). The manufacturing tolerances are efficiently compensatable by means of the actuator according to the invention.

Additionally, travels of between 100 and 500 µm, for example, are realizable by means of the SM elements. Larger travels allow a lower manufacturing accuracy of the adjacent mechanism, contributing to a reduction in the manufacturing costs. No additional measurement system for readjustment is required if the SM elements or the actuator are optionally embodied for self-analysis or self sensing.

Should a reached adjustment position be maintained over a relatively long period of time, e.g., for several hours, days, weeks or months, use can be made of the self-retention effect of the shape-memory material. Better yet, a brake or a clamping unit and/or a clamping element is additionally provided, the effect thereof causing the element to be moved to be affixable or affixed at the current adjustment position.

It is also possible to secure a reached adjustment position by the effect of a frictional force, which occurs between the element to be moved and the carrier, for example. To this end, the element to be moved can be connected to the carrier by means of springs and/or magnets, with an embodiment with magnets, in particular, permitting small installation spaces and low costs. By way of example, a plurality of magnets are attached to the element to be moved, wherein the element to be moved may consist of, for example, a non-magnetic material such as aluminum, plastic, glass or an appropriate composite material. The carrier consists of a magnetic (ferromagnetic) material or contains regions made of such a magnetic (ferromagnetic) material.

The magnetic forces acting between the magnets and the carrier hold the element to be moved on the carrier. Here, it is advantageous if the magnets are arranged and dimensioned in such a way that an air gap remains between these and the carrier. Such an embodiment allows a high accuracy and causes fewer errors than if, in addition to the element to be moved, the magnets also come into direct contact with the carrier. The frictional forces arising between the element to be moved and the carrier lead to a self-retention effect between these components. The frictional forces should be lower than the actuating forces caused or causable by means of the SM element or elements present. Compared to the brakes or clamping units described below, this self-retention effect is low, but it is usually sufficient to compensate small disturbance forces, such as slight vibration-caused accelerations, for example.

In further embodiments, both the carrier and the element to be moved can have magnets. Magnets lying opposite one another are arranged with opposing poles such that these attract.

It is possible to construct a positioning system in which the element to be moved is moved to a desired position by means of actuators, in particular by means of SM elements. The element to be moved is secured at the desired position as a consequence of the frictional forces caused by the magnetic forces. Suitable sensors can monitor whether this position is maintained. If an inadmissible deviation from the desired position of a current position (actual position) of the element to be moved is determined, the element to be moved is returned into the desired position by virtue of the SM elements being actuated accordingly.

The advantages of such a system consist in no additional brakes or clamping units being required and in the SM elements only being actuated, e.g., powered, if the element to be moved is no longer situated at the desired position (intended position).

In a further embodiment option, one or more sensors, for example in the form of induction coils, can be arranged on the carrier. By way of example, three induction coils, each offset at an angle of 120° from the others, are present. The element to be moved must consist of, or contain, an electrically conductive material. A current position of the element to be moved can be captured by means of the induction coils; by way of example, this can be calculated from the measured values of the induction coils. The measured values of at least one of the induction coils, for example the inductance and/or the impedance, change if there is a change in the distance between the element to be moved and said induction coil. The current distances—and accordingly the respective changes in the distance—can be established by means of a suitable converter, for example an inductance-to-digital converter like the LDC1000 inductance-to-digital converter by Texas Instruments (registered trademark). The sensors may also be arranged on the element to be moved in further embodiments.

After the system of sensors, carrier and element to be moved has been calibrated once, the current positions of carrier and element to be moved, and the distances thereof, can be measured precisely. In the case of inadmissible deviations, the SM elements can be actuated in such a way that a desired position of carrier and element to be moved is achieved again. What is advantageous here is that the element to be moved can be detected directly and no additional magnets or other components are required. It is possible to realize highly integrated solutions with small installation space requirements and low costs. Thus, it is possible to use induction coils of approximately 5×5 mm$^2$, for example, the accuracy and reproducibility of which lies in the region of a few µm. In a further possible embodiment, the brake or the clamping unit has at least one spring element, for example a split washer, the effect of which presses the element to be moved, or an element held by the element to be moved, such as, e.g., a lens, a stop or a filter, against an abutment. By means of at least one SM element, the element to be moved is moved transversely to the force effect of the brake or the clamping unit or movable transversely to the force effect of the brake or the clamping unit.

A connection between the SM element and the element to be moved can be realized by a force-fit, interlocking and/or cohesive connection. Such a connection also is understood to mean embodiments in which the SM element rests on the element to be moved, at least over a portion of its extent, and/or in which the SM element is guided through the element to be moved and mechanically interacts with the latter.

The SM element can be supported on the carrier with a loose end or with a portion that does not have a form-fit or cohesive connection to the carrier. In further embodiments, the SM element can be detachably or non-detachably connected to the carrier.

By way of example, connections are detachable connections, in particular force-fit and/or interlocking connections, such as screwed connections, clamped connections or plug-in connections. In further embodiments, connections can be nondetachable force-fit, interlocking and/or cohesive connections, such as adhesively bonded connections, welded connections, cast connections or press-fit connections.

In a further embodiment of the actuator, at least one clamping element that is driven or drivable by means of an SM element is present, the force effect of said clamping element being directed on the element to be moved and the element to be moved being clamped against an abutment as a result of said force effect of said clamping element such that the clamped element to be moved is held in a clamped position. The force effect occurs in the driven state. If the clamping element is not driven, the force effect is directable on the element to be moved and the element to be moved is clampable at a clamped position.

In further possible embodiments, the clamping element can be driven when the SM element is in the cooled down and/or current-free state. If the element to be moved should be moved into position, the SM element is heated, and/or an electric current is passed therethrough. The force effect of the clamping element abates or is removed such that the element to be moved is movable into position. In order to affix the element to be moved at its appointed position, the SM element of the clamping element is cooled again and/or switched into a current-free state, whereupon the force effect of the clamping element sets-in again and the element to be moved is held in its position. A corresponding statement applies to the effect of a magnetic field on the SM element or the deactivation thereof.

By way of example, such an embodiment is advantageous if the element to be moved is adjusted prior to delivery, for example to a customer, or during the in situ assembly of a product comprising the actuator and if said element should be held at the clamped position for a relatively long period of time (so-called set-and-forget applications).

In further embodiments, it is possible for the clamping element to be driven when the SM element is in the heated and/or current-carrying state. If the element to be moved should be moved into position, the SM element is cooled and/or switched into the current-free state. The force effect of the clamping element abates or is removed such that the element to be moved is movable into position. In order to affix the element to be moved at its appointed position, the SM element of the clamping element is heated again, and/or an electric current is passed therethrough. A corresponding statement applies to the effect of a magnetic field on the SM element or the deactivation thereof.

The clamping element can be formed directly by the driving SM element, which then has a direct connection to the element to be moved. This embodiment is very space-saving and saves much material.

In a further possible embodiment, at least one of the SM elements is substantially formed from a magnetic shape-memory material. Advantageously, such an SM element can be actuated by the effects of one or more magnetic fields. By way of example, no electrical connectors are required on the SM element.

In further embodiments, electrical and/or electronic components can be dispensed with on the actuator if the latter is actuated by means of suitable magnetic fields.

In this case, the SM element consisting of the magnetic shape-memory material can be one of the SM elements connected to the element to be moved and/or the at least one SM element.

If the SM elements are operated in the opposite sense in further embodiments of the actuator, the force effect of at least one SM element can be partly compensated by the force effects of at least one further SM element, as a result of which driving beyond a desired position can be largely avoided.

Instead of SM elements operated in the opposite sense, or in addition thereto, provision can be made of at least one spring element, which acts as an antagonist to the at least one SM element.

In a further embodiment, the actuator can have at least two SM elements, which are arranged in such a way that their respective directed force effects are at least partly directed against one another. The opposing SM elements can be operated in the opposite sense. For example, if a contraction is brought about in one of the SM elements, an extension is caused in the opposite SM element as a compensation.

In further embodiment options, the SM elements are aligned in such a way that the force effects thereof are not directed precisely counter to one another. By means of such an embodiment, an element to be moved that is connected to both SM elements is displaceable, in partial fashion, in all spatial directions and tiltable about at least one axis of rotation.

In order to actuate the SM element consisting of a magnetic shape-memory material and bring about a shape change of the SM element, at least one coil for producing a magnetic field is arranged in such a way in a further embodiment of the actuator that the magnetic field lines of the magnetic field extend transversely to the occurring directed force effect of the at least one SM element made of magnetic shape-memory material.

Advantageously, a contactless actuation of the SM element is possible by means of the magnetic field.

The actuator can be a constituent part of an arrangement, for example a mechanical arrangement or an optical arrangement. Here, the arrangement has a wall delimiting the displacement path at at least one of its sides, for example a wall of a housing or a tube. Furthermore, a conductor made of a magnetically conductive material is present, wherein the conductor, over at least a portion of its length, extends in the wall and the conductor is connected to at least one of the SM elements in such a way that a magnetic field lines guided in the conductor interact with the SM element. Provided the interactions are strong enough, the force effect is caused as a result thereof.

The advantages of such an embodiment lie in small spatial requirements and a robust embodiment of the actuator. By way of example, such an embodiment is usable for displacing optical lenses along an optical axis, for example of an optical apparatus.

An optical apparatus is an objective, in particular. In further embodiments, the optical apparatus can also be an optical bench, a portion of a beam path of an optical appliance, for example of a microscope or of an optical measuring appliance. The optical apparatus may also be embodied as a cinema lens, camera lens, telescopic sight, binocular field glasses or monocular field glasses.

The actuator can be arranged in the optical apparatus in order to move optical elements, e.g., optical lenses, there.

According to the prior art, movements in the interior of optical apparatuses, e.g., in objectives or other optical or optomechanical assemblies, were previously brought about by drives which were displaced from the optical assemblies to the outside and operated by means of electric motors, for example.

An embodiment with an integrated actuator advantageously avoids, for example, an embodiment of available optical or optomechanical assemblies that requires much space. Moreover, the actuation forces producible by means of an actuator according to the invention are greater than those that are achievable by means of miniaturized piezodrives, for example.

The element to be moved can be a holder or a mount, in which a component to be adjusted, for example one or more optical lenses, a stop, a mirror, a filter, a sensor or a grating, is held or can be held.

The element to be moved can also have a monolithic embodiment and itself be the component to be adjusted. By way of example, the element to be moved can be a plate with an aperture. The element to be moved can also be one or more lenses, stops and/or a prism system, in particular an erecting system.

It is also possible for at least two elements to be moved to be present, said elements being embodied as optical free-form elements. By way of example, an Alvarez plate is embodied in each case, said Alvarez plates being intended to be moved relative to one another. The movement of Alvarez plates, in particular, requires a very precise movement in a tightly restricted installation space.

Further, the object is achieved by an adjustment apparatus, which comprises an evaluation unit for evaluating current spatial coordinates, including coordinates in space and relative spatial orientations, of the elements to be moved and/or of the SM elements. Moreover, a control unit for generating control commands depending on the evaluated current spatial coordinates is present. By way of example, the spatial coordinates can be two-dimensional coordinates and/or coordinates in space and/or relative spatial orientations, for example of the element to be moved and of a profile of a current beam path of an optical arrangement, for example of a microscope, a measuring appliance, an appliance for use in a surgical or therapeutic method, an illumination apparatus or an exposure apparatus.

In a developed embodiment of the apparatus, the evaluation unit and/or the control unit, which can be referred to together as control unit, is configured to generate the control commands on the basis of calculation prescriptions depending on incoming measured values of operating parameters and/or depending on selectable modes of operation of the apparatus.

By way of example, calculation prescriptions are stored lookup tables or mathematical functions accessible by the control unit, which predetermine a relationship between the measured values and the control commands to be generated.

By way of example, modes of operation are the use of different wavelengths or wavelength regions, for example for carrying out measurements on a sample.

In a further embodiment, the apparatus can be embodied in such a way that the control unit is connected to at least one further component via a data link and the control unit is configured to generate the control commands depending on received data from the at least one further component.

The actuator, the arrangement and the apparatus can be used, for example, in optical systems such as microscopy systems of any type, for example laser scanning microscopes, electron microscopes or wide-field microscopes.

An arrangement can have a plurality of actuators according to the invention in the same embodiment or in different embodiments.

In further embodiments of the arrangement, the actuators present can be adjustable in mutually different directions X, Y and/or Z. Further, actuators according to the invention can be combined with stationary installed components, for example optical lenses, stops and/or filters.

By means of the adjustment apparatus, a possibility of the actuator for correction adjustments of the element or elements to be moved is specified, for example. The required adjustments can be implemented both radially and axially.

In the case of inaccessibility of the optical component, for example as a result of an incubation structure, the adjustment according to the prior art must be driven by motor from the outside, while the adjustment apparatus according to the invention provides a drive in the interior of the optical component. Advantageously, a displacement of the actuator to outside of the optical component has been avoided.

The actuator can be used to move components of an objective into position. It can also be used to adjust an element to be moved comprising a pinhole, a stop or a correction mirror. A further possible use of the actuator lies in the adjustment of at least two optical elements relative to one another. The optical elements can be optical free-form elements, for example Alvarez plates, optical lenses and/or sensors.

The actuator and/or the adjustment apparatus can be used to adjust a sensor.

The element to be moved and an element to be adjusted grasped or held therewith (referred to together as element to be moved in a simplified fashion) are moved in controlled fashion by means of the actuator. To this end, actual measured values of a sensor can be captured and evaluated, for example by virtue of the actual measured values being compared to intended measured values. The control commands are generated depending on the result of the comparison.

By way of example, the measured values are capturable by means of a resistance measurement of the SMA elements. In further embodiments, the measured values are alternatively or additionally established with the aid of image evaluation methods.

A generation of control commands can be omitted if the deviation of actual measured values from intended measured values remains within an admissible tolerance limit.

The proposed solutions, in particular the actuator, the uses thereof and the adjustment methods advantageously allow one or more elements to be moved to be adjusted over small distances with high accuracy and very good reproducibility. The described solutions facilitate the use of actuators under structurally difficult conditions, in the case of little available installation space and with little expenditure.

Advantageously, no tool accesses are necessary. A live adjustment, i.e., an adjustment under temporally close observation, is possible. The apparatus can be adjusted in the completely assembled state, and so no renewed disassembly and/or post-processing are necessary.

Further advantages consist in the option of carrying out an in situ adjustment at the customer, with this being able to be implemented, for example, via a network without immediate presence of a service technician. Naturally, the adjustment can also be carried out in situ by a service technician.

The apparatus, in particular the control unit, can be configured in such a way that a post-adjustment, as may be necessary after transporting the apparatus or after a certain period of use, for example, is undertaken. To this end, a factory state of the apparatus can be stored in a memory of the control unit or in a memory connected therewith, said factory state being checked or re-established during the post-adjustment.

Further, the control unit can also be configured in such a way that an optimization of the apparatus, i.e., the performance indicators thereof, such as the resolution or the precision of moving the element to be moved to a desired intended position, is implemented depending on external influences.

Thus, measured values of the current room temperature can be captured. The stored calculation prescriptions are used to generate control commands in order to compensate possible effects of temperature changes, e.g., changes in the length of parts of the apparatus and/or of the actuator.

The arrangement or the apparatus can likewise be used together with other system components. The calculation prescriptions can be selected and/or modified depending on the other actually present system components.

Figure 1B:
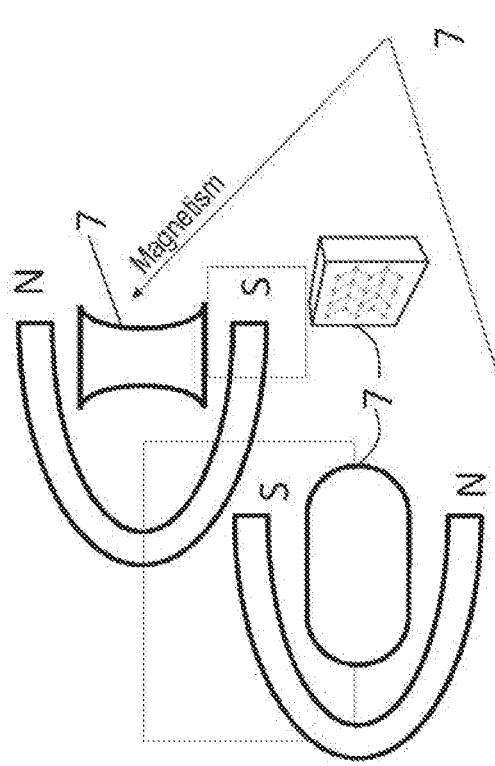
FIG. 1*b* shows a schematic illustration of a shape-memory element made of a magnetic shape-memory material, and the behavior thereof under different magnetic field influences.
Figure 1C:
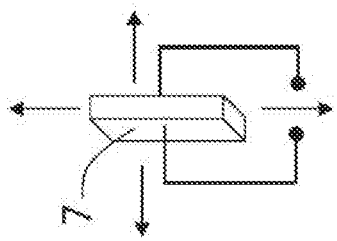
FIG. 1*c* shows a schematic illustration of a shape-memory element made of a dielectric elastomer as shape-memory material, and the behavior thereof in an electric field.
Figure 4:
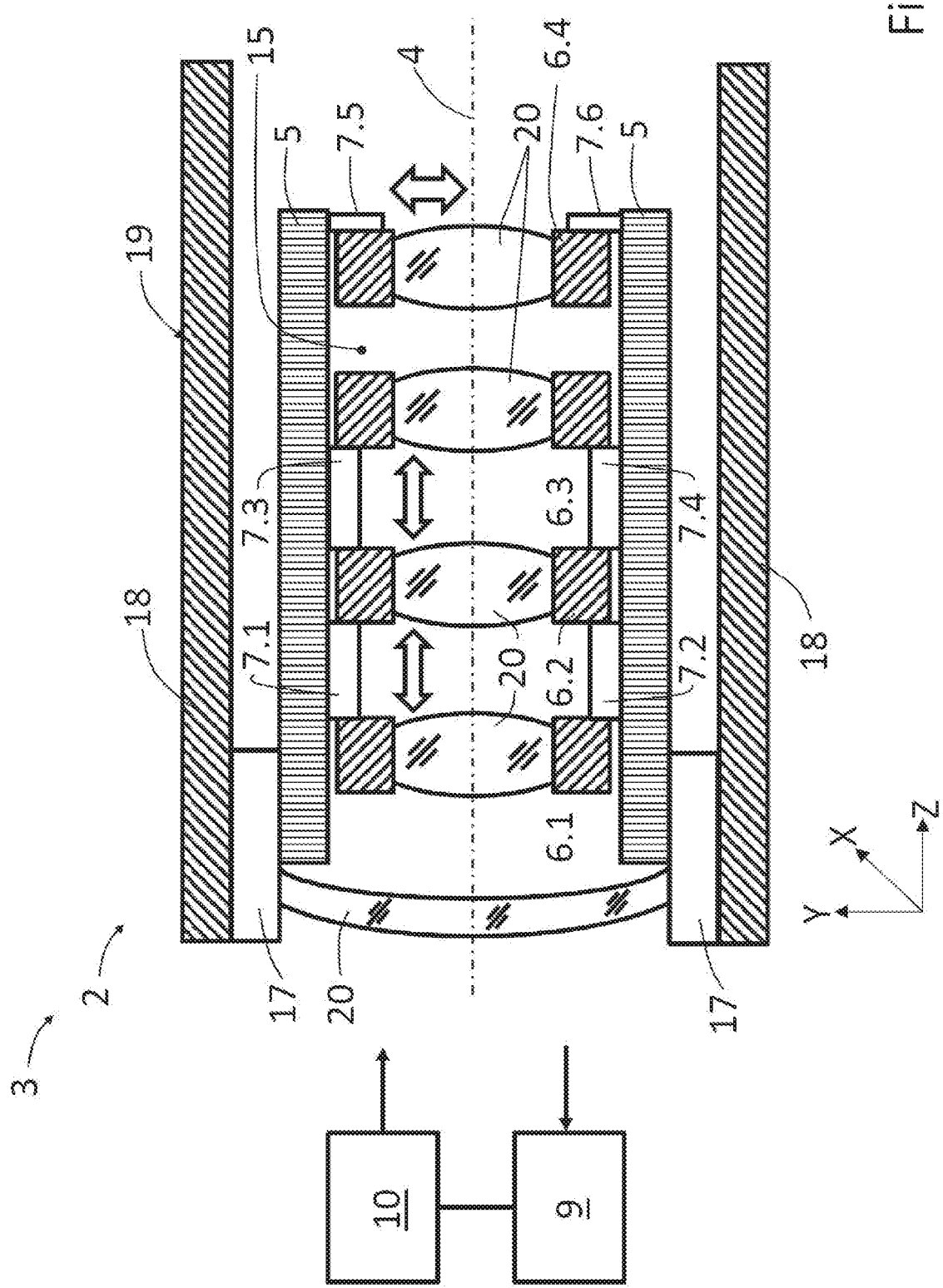
FIG. 4 shows a schematic illustration of a longitudinal section of an exemplary embodiment of an optical apparatus according to the invention with a plurality of actuators that, at the same time, is embodied as a second exemplary embodiment of an apparatus according to the invention for adjusting elements to be moved.
Figure 7:
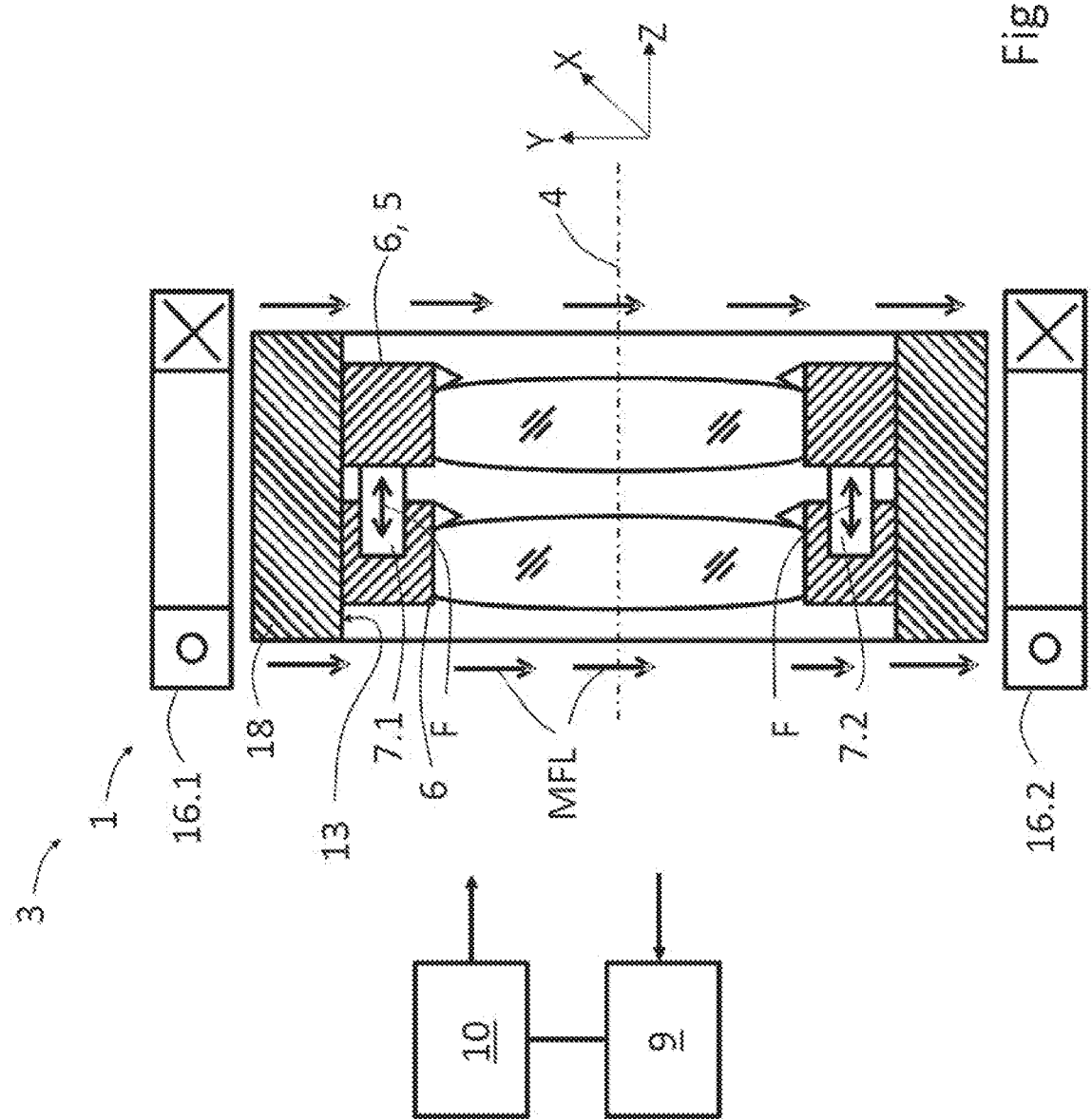
FIG. 7 shows a schematic illustration of a fifth exemplary embodiment of an actuator according to the invention and of a fifth exemplary embodiment of the apparatus according to the invention.
Figure 8:
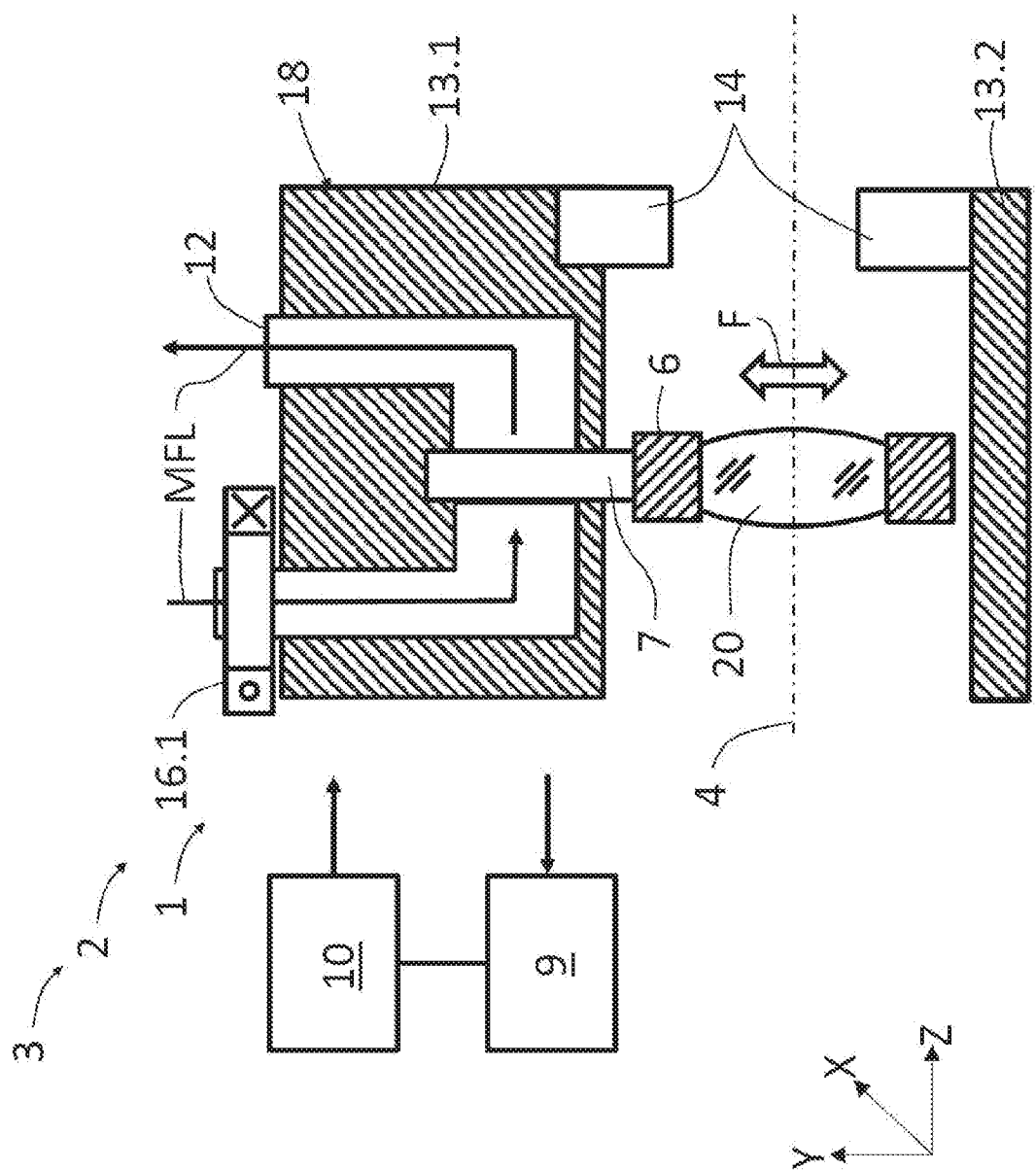
FIG. 8 shows a schematic illustration of a sixth exemplary embodiment of the actuator according to the invention and of a sixth exemplary embodiment of the apparatus according to the invention and an exemplary embodiment of an arrangement according to the invention.
Figure 9:
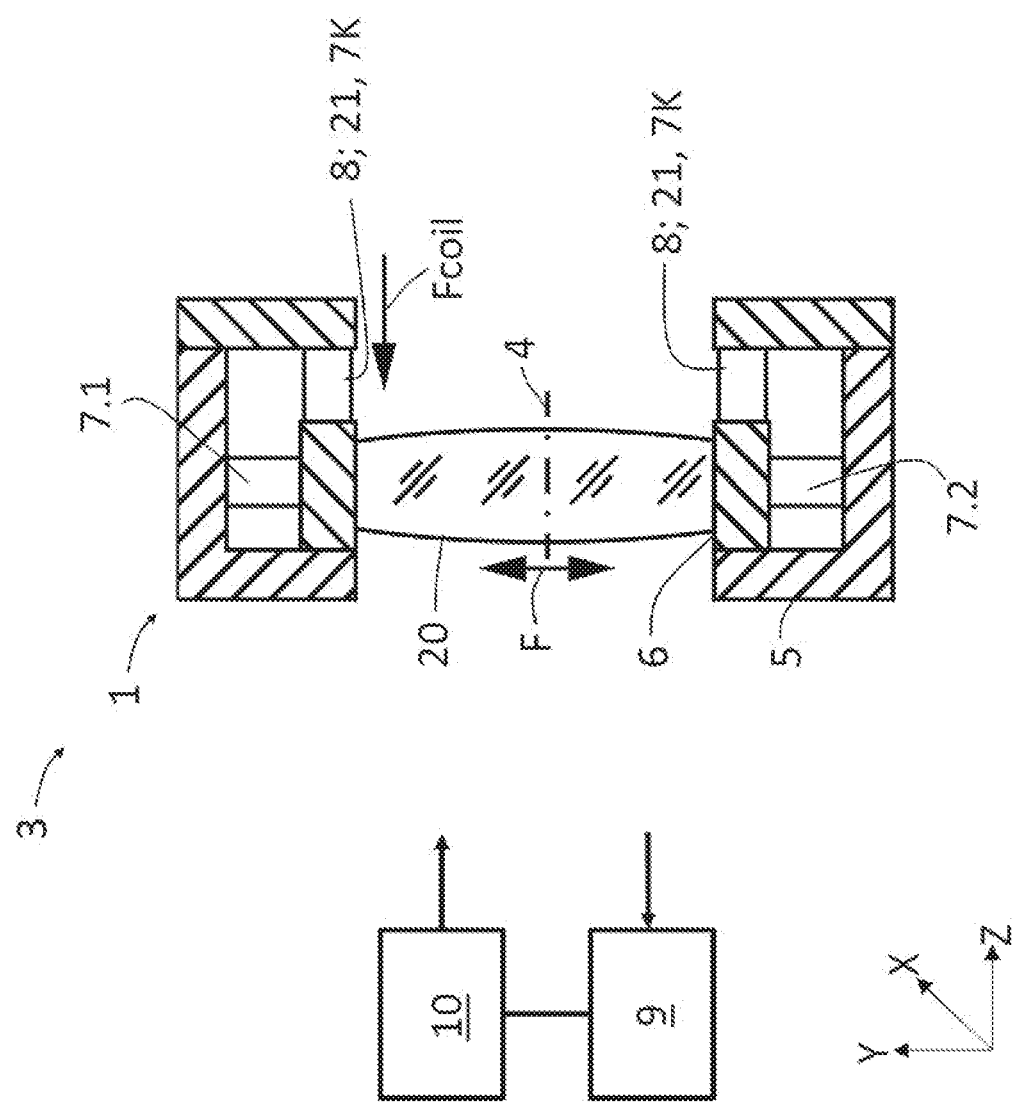
FIG. 9 shows a schematic illustration of a seventh exemplary embodiment of the actuator according to the invention and of a seventh exemplary embodiment of the apparatus according to the invention.
Figure 10:
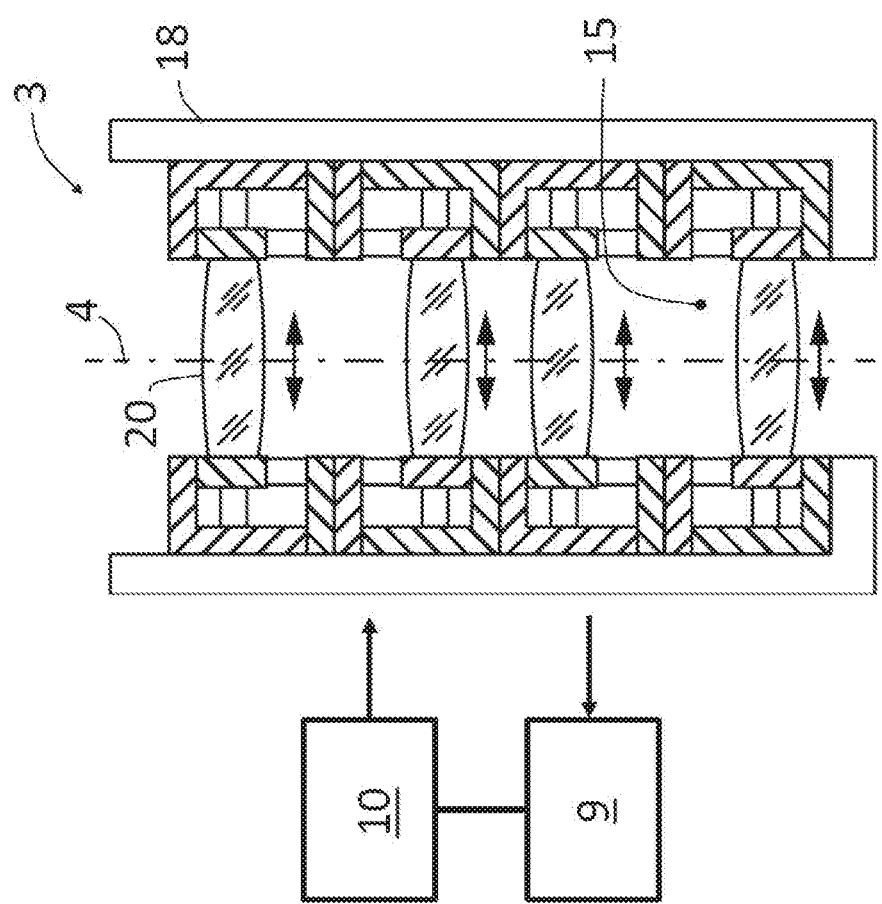
FIG. 10 shows a schematic illustration of an eighth exemplary embodiment of the apparatus according to the invention with actuators according to the seventh exemplary embodiment.
Figure 11:
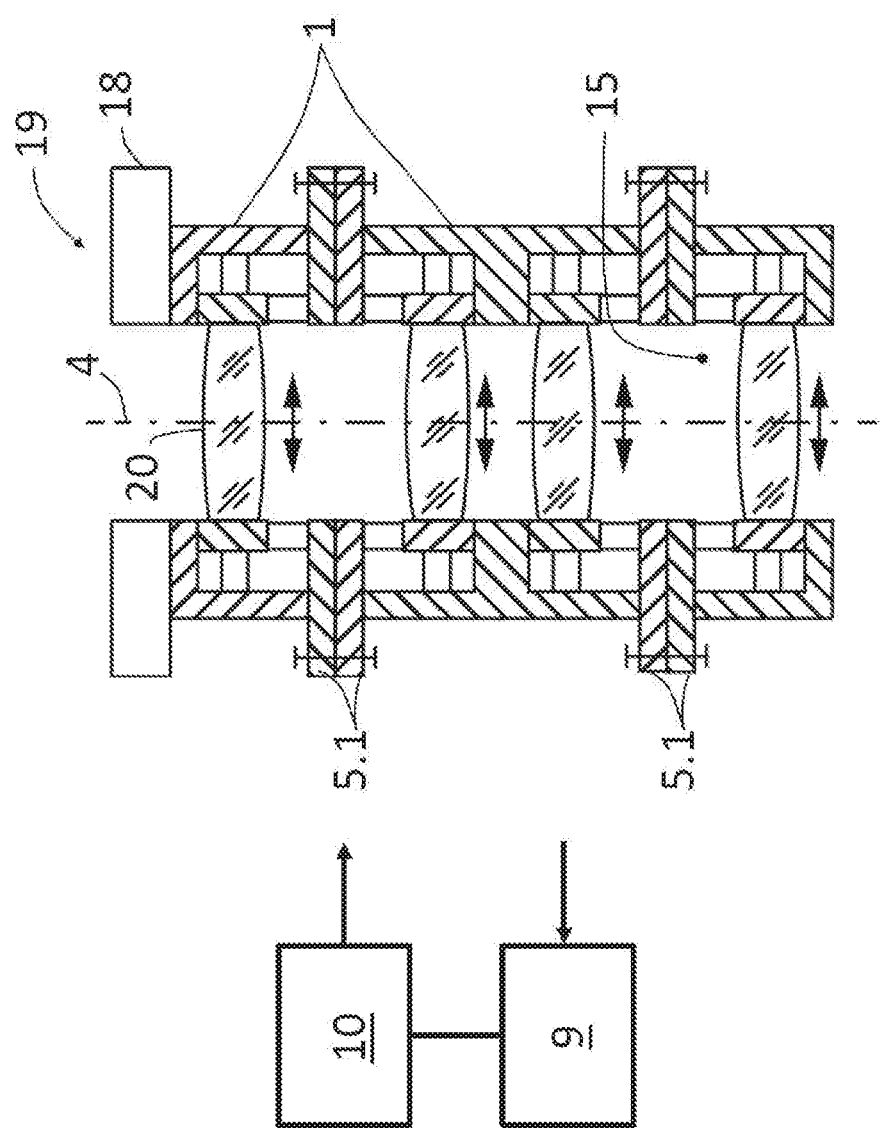
FIG. 11 shows a schematic illustration of a ninth exemplary embodiment of the apparatus according to the invention with actuators according to an eighth exemplary embodiment.
Figure 16:
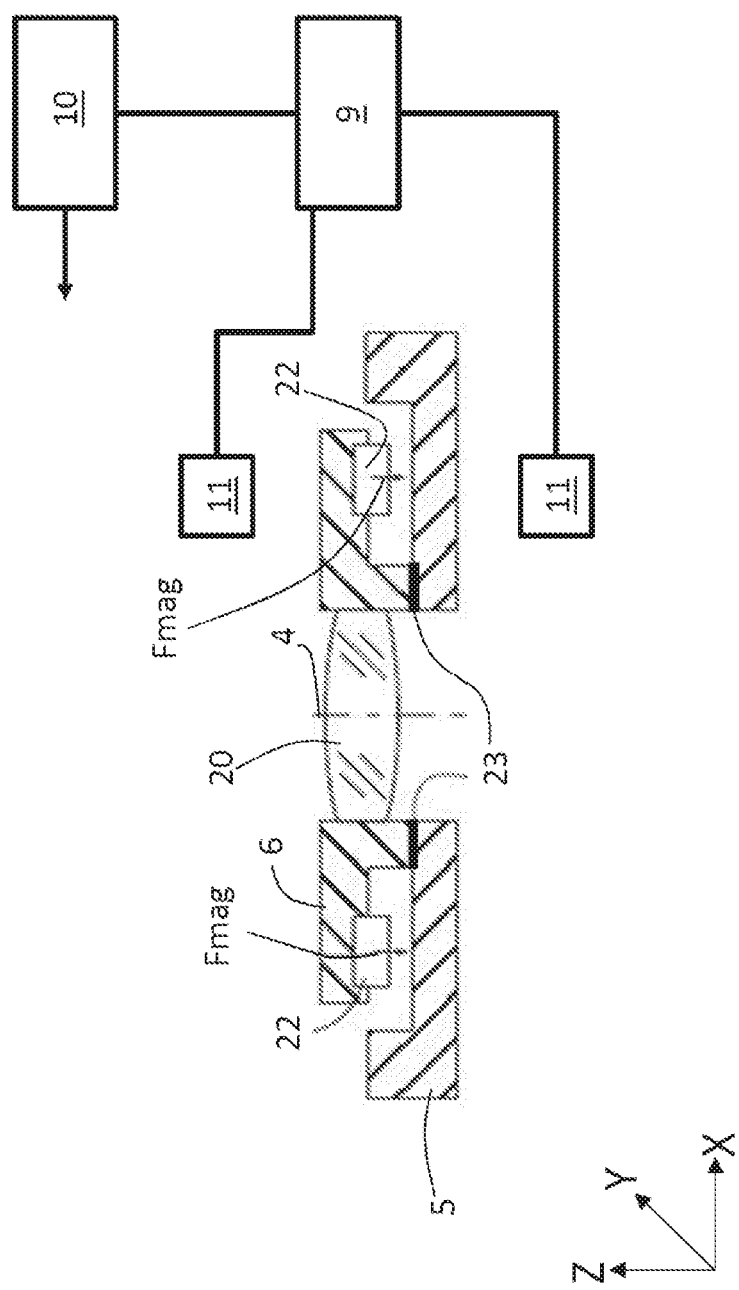
FIG. 16 shows a schematic illustration of a thirteenth exemplary embodiment of the apparatus according to the invention with magnets for connecting carrier and element to be moved, in a side view as a sectional illustration.
Figure 17:
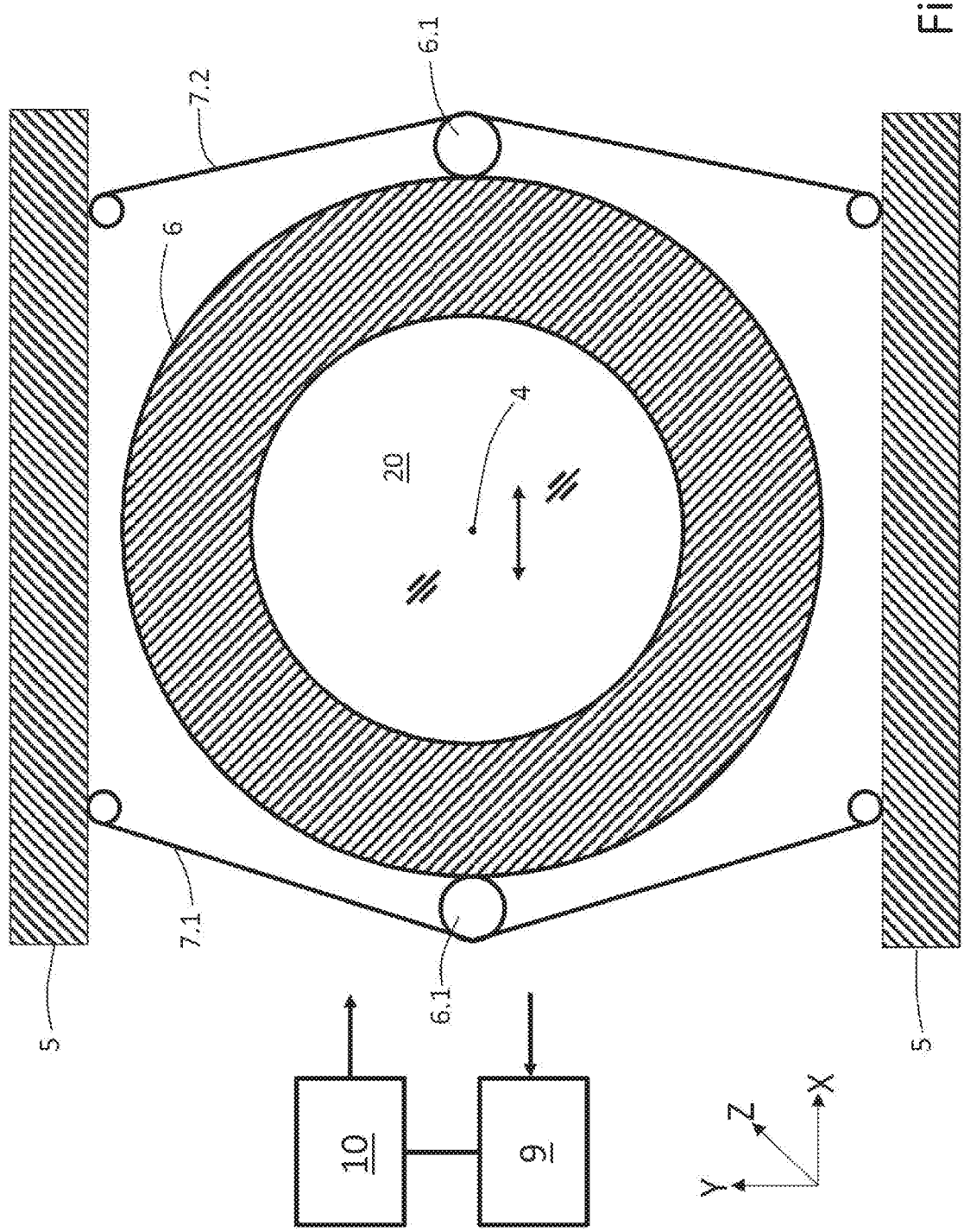
FIG. 17 shows a schematic illustration of the thirteenth exemplary embodiment of the apparatus according to the invention, in a plan view with radially effective SM elements.
Figure 18:
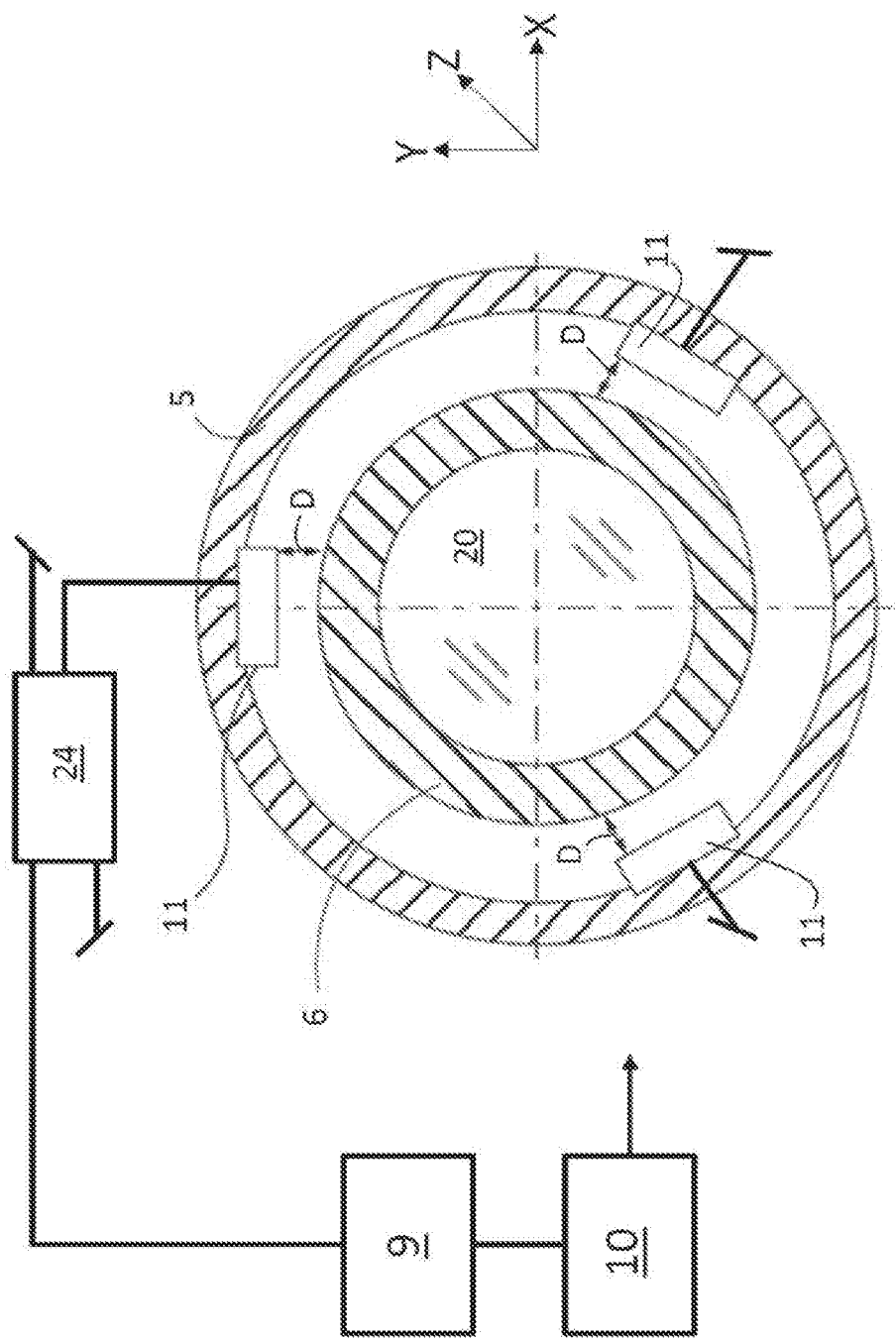
FIG. 18 shows a schematic illustration of a fourteenth exemplary embodiment of the apparatus according to the invention with sensors for inductively measuring positions.

The invention is explained in more detail below on the basis of exemplary embodiments and figures. In the figures:

FIG. 1a shows a schematic illustration of a shape-memory element made of a memory alloy, and the behavior thereof upon deformation and heating;

FIG. 1b shows a schematic illustration of a shape-memory element made of a magnetic shape-memory material, and the behavior thereof under different magnetic field influences;

FIG. 1c shows a schematic illustration of a shape-memory element made of a dielectric elastomer as shape-memory material, and the behavior thereof in an electric field;

FIG. 2a shows a schematic illustration of a first exemplary embodiment of an actuator according to the invention, in a lateral illustration, FIG. 2b shows a schematic illustration of the first exemplary embodiment of an actuator according to the invention, in a lateral plan view, FIG. 3 shows a schematic illustration of a second exemplary embodiment of an actuator according to the invention with a shape-memory element as a clamping element and a first exemplary embodiment of an apparatus for adjusting elements to be moved, FIG. 4 shows a schematic illustration of a longitudinal section of an exemplary embodiment of an optical apparatus according to the invention with a plurality of actuators that, at the same time, is embodied as a second exemplary embodiment of an apparatus according to the invention for adjusting elements to be moved, FIG. 5a shows a schematic illustration of a third exemplary embodiment of the actuator according to the invention and of a third exemplary embodiment of the apparatus according to the invention in a plan view, FIG. 5b shows the schematic illustration of the third exemplary embodiment of the actuator according to the invention and of the third exemplary embodiment of the apparatus according to the invention in a lateral sectional illustration, FIG. 6a shows a schematic illustration of a fourth exemplary embodiment of the actuator according to the invention and of a fourth exemplary embodiment of the apparatus according to the invention in a plan view, FIG. 6b shows the schematic illustration of the fourth exemplary embodiment of the actuator according to the invention and of the fourth exemplary embodiment of the apparatus according to the invention in a lateral sectional illustration, FIG. 7 shows a schematic illustration of a fifth exemplary embodiment of an actuator according to the invention and of a fifth exemplary embodiment of the apparatus according to the invention, FIG. 8 shows a schematic illustration of a sixth exemplary embodiment of the actuator according to the invention and of a sixth exemplary embodiment of the apparatus according to the invention and an exemplary embodiment of an arrangement according to the invention, FIG. 9 shows a schematic illustration of a seventh exemplary embodiment of the actuator according to the invention and of a seventh exemplary embodiment of the apparatus according to the invention, FIG. 10 shows a schematic illustration of an eighth exemplary embodiment of the apparatus according to the invention with actuators according to the seventh exemplary embodiment, FIG. 11 shows a schematic illustration of a ninth exemplary embodiment of the apparatus according to the invention with actuators according to an eighth exemplary embodiment, FIG. 12 shows a schematic illustration of a tenth exemplary embodiment of the apparatus according to the invention with actuators according to a ninth exemplary embodiment, FIG. 13 shows a schematic illustration of an eleventh exemplary embodiment of the apparatus according to the invention with actuators according to the seventh and the ninth exemplary embodiment, FIG. 14 shows a schematic illustration of a twelfth exemplary embodiment of the apparatus according to the invention with an actuator according to a tenth exemplary embodiment, FIG. 15a shows a schematic illustration of a twelfth exemplary embodiment of the apparatus according to the invention with an actuator according to a tenth exemplary embodiment in a plan view, FIG. 15b shows a schematic illustration of the twelfth exemplary embodiment of the apparatus according to the invention with the actuator according to a tenth exemplary embodiment in a side view, FIG. 16 shows a schematic illustration of a thirteenth exemplary embodiment of the apparatus according to the invention with magnets for connecting carrier and element to be moved, in a side view as a sectional illustration, FIG. 17 shows a schematic illustration of the thirteenth exemplary embodiment of the apparatus according to the invention, in a plan view with radially effective SM elements, and FIG. 18 shows a schematic illustration of a fourteenth exemplary embodiment of the apparatus according to the invention with sensors for inductively measuring positions.

The same technical elements are labeled by the same reference signs in the schematic illustrations of the exemplary embodiments if nothing else is expressly specified. The illustrations are not true to scale. FIGS. 1a to 1c were taken from the website http://www.smarthoch3.de/ueber-smart3/smart-materials (as of May 30, 2016) and complemented by figure numbers and reference signs. FIGS. 2 to 15b are shown as sectional illustrations or partial sections.

The properties of a shape-memory element 7 (below: SM element 7) made of a thermal shape-memory alloy are illustrated in partial FIGS. (1) to (4) of FIG. 1a. The SM element 1 has a certain lattice structure in an initial form (partial FIG. 1)). If the SM element 7 is brought into a modified form, for example by a mechanical force effect (partial FIG. 2)), the lattice structure thereof is modified at least in regions. If a stimulus, heat in the illustrated case, acts on the deformed SM element 7 (partial FIG. 3)), the latter readopts its initial form (partial FIG. 4)). If the SM element 7 cools again, the original lattice structure is re-established.

Magnetic shape-memory materials (FIG. 1b) also behave as explained above. A change in form of the SM element 7 is brought about depending on the direction and strength of the magnetic field acting on the SM element 7, as illustrated by the associated magnetic field lines MFL (see FIGS. 5 to 7).

So-called dielectric elastomer actuators substantially consist of a dielectric elastomer. If the latter is exposed to an electric field, there is a change in the form and/or dimensions of the DEA (FIG. 1c).

As essential components, an actuator 1 comprises an element 6 to be moved, a carrier 5 and at least one SM element 7, wherein the SM element 7 is connected to the element 6 to be moved and embodied so as to be supported on the carrier 5 (FIG. 2a).

A first SM element 7.1 and a second SM element 7.2 are present in a first exemplary embodiment of an actuator 1 according to the invention. The element 6 to be moved is embodied as a mount of an optical lens 20. Clear space 15 is situated around the element 6 to be moved between the element 6 to be moved and the carrier 5, which is formed here by a tube 18 or, in view of further possible embodiments, more generally by a housing 18. The SM elements 7.1, 7.2 are arranged in the clear space 15.

A directed force effect F is exerted on the element 6 to be moved (symbolized by means of the double-headed arrows) as a result of a change in the extent of the SM elements 7.1 and/or 7.2 in at least one of their dimensions, the directed force effect yielding the element 6 to be moved displaceable in the XY-plane XY and the optical lens 20 adjustable in relation to an optical axis 4, extending in the direction of the Z-axis Z, of an optical arrangement 2 not illustrated in any more detail.

In further embodiment options of the actuator 1, the SM elements 7.1 and 7.2 are arranged and embodied in such a way that the force effect F is produced in the direction of the Z-axis Z and the element 6 to be moved is adjustable along the optical axis 4 together with the optical lens 20.

In further embodiments, displacements of the element 6 to be moved may be realizable both in the XY-plane XY and in the direction of the Z-axis Z by means of the SM elements 7.1, 7.2.

FIG. 3 shows a second exemplary embodiment of an actuator 1 according to the invention with an SM element 7.1 for adjusting the element 6 to be moved along the optical axis 4 and a clamping element 8 that is driven by means of an SM element 7K. In the exemplary embodiment according to FIG. 3, the clamping element 8 is formed by the SM element 7K itself, which is directly connected to the element 6 to be moved.

The element 6 to be moved is displaceable along the Z-axis Z, which once again coincides with the optical axis 4, by means of the first SM element 7.1. The force F effect of the SM element 7K is directed or directable in orthogonal fashion to the direction of the force effect F of the first SM element 7.1 on the element 6 to be moved. The first SM element 7.1 is supported on the carrier 5, which is formed onto the housing 18.

In the illustrated exemplary embodiment, the SM element 7K is an MSM-SM element made of a magnetic shape-memory material. The SM element 7.1 substantially consists of a shape-memory alloy and it is thermally actuatable.

In further embodiments, the SM element 7.1 and the SM element 7K can each consist of a thermally controllable shape-memory material, a magnetically controllable shape-memory material or a dielectric elastomer as shape-memory material.

The corresponding interchangeability of the shape-memory materials of the SM elements 7 or of the SM elements 7K of the clamping elements 8 applies to all described embodiments of the invention, unless something else is explicitly stated.

An evaluation unit 9 and a control unit 10 are present to control the movements and the force effects F of the SM elements 7.1 and 7K. By means of the control unit 10, the SM elements 7.1 and 7K are actuatable independently of one another. Here, the actuation is implemented by virtue of, for example, an electric current with a certain amplitude and with a certain voltage flowing through each of the SM elements 7.1, 7K. A change in at least one dimension of the SM elements 7.1, 7K is brought about as a consequence of the ohmic resistance of the respective SM elements 7.1, 7K and the heat produced in the process.

A current length and a current ohmic resistance of each of the SM elements 7.1, 7K is capturable by means of a suitable measuring circuit 11 known to a person skilled in the art or by means of a sensor 11. The measured values obtained in the process are transmitted to the evaluation unit 9, which, in turn, is connected to the control unit 10 in a manner suitable for the transmission of data and which may be embodied as a constituent part or subunit thereof. The evaluation unit 9 is configured to evaluate current spatial coordinates, for example of the SM elements 7.1, 7K, and the current extension states thereof, the current spatial position of a beam path of the optical arrangement 2 and/or the current relative orientation of the element 6 to be moved in relation to the current beam path.

The actuator 1, the evaluation unit 9 and the control unit 10 are essential elements of an apparatus 3 for adjusting the element 6 to be moved, the first exemplary embodiment of which is shown in FIG. 3.

The control unit 10 generates and outputs control signals for actuating the SM elements 7.1, 7K depending on the measured values transmitted by the evaluation unit 9 and/or on evaluation results of the evaluation unit 9 and optionally by making use of further measured values such as the ambient temperature, for example. The optical axis 4 of the optical arrangement 2 is specified by the current beam path or the current profile thereof.

The control commands are implemented in apparatuses not illustrated here and the corresponding current flows and/or temperature changes of the SM elements 7.1, 7K are brought about.

The element 6 to be moved can be adjusted along the optical axis 4. If the element 6 to be moved is adjusted along the Z-axis Z by means of the first SM element 7.1 and situated at a current adjustment position, a control command for the SM element 7K is generated and implemented, whereupon the element 6 to be moved is pressed against the carrier 5 by the force effect F of the SM element 7K and held at the current adjustment position in a clamped position.

A second exemplary embodiment of an optical apparatus 3 according to the invention with a plurality of actuators 1 is illustrated in FIG. 4. At the same time, the optical apparatus 3 in the form of an objective 19 is embodied as an apparatus 3 according to the invention for adjusting elements 6 to be moved.

A mount 17 of an optical lens 20 embodied as a front lens and a tubular carrier 5 are arranged in a housing 18. In the carrier 5, there are four elements 6.1 to 6.4 to be moved in the form of mounts of optical lenses 20, which are strung along the optical axis 4 of the optical arrangement 2. The SM elements 7.1 and 7.2, and 7.3 and 7.4, respectively, are situated between the elements 6.1 and 6.2, and 6.2 and 6.3, respectively, to be moved. The elements 6.1 to 6.3 to be moved are adjustable in the direction of the Z-axis Z in the direction of the optical axis 4 of the arrangement 2 by means of the respective SM elements 7.1 to 7.4.

The element 6.4 to be moved is directly connected to the SM elements 7.5 and 7.6 and adjustable in the XY-plane XY.

In a further embodiment, some or all of the first to third elements 6.1 to 6.3 to be moved can be provided with a clamping element 8 (see FIG. 3). As an alternative or in addition to clamping elements 8 of the first to third elements 6.1 to 6.3 to be moved, the fourth element 6.4 to be moved can be provided, in a further embodiment, with a clamping element 8, as described in FIG. 5b, for example.

FIG. 5a shows a plan view along the optical axis 4 of a third exemplary embodiment of the actuator 1 according to the invention and a third exemplary embodiment of the apparatus 3 according to the invention.

The element 6 to be moved is directly connected via four SM elements 7.1 to 7.4 to the housing 18 acting as carrier 5.

Further elements, which were omitted from FIG. 5a for reasons of clarity, can be seen in the lateral sectional illustration of the third exemplary embodiment of the actuator 1 and of the apparatus 3.

The element 6 to be moved, and hence the optical lens 20, are adjustable in the XY-plane XY. When a current adjustment position is reached, the element 6 to be moved is pressed in the axial direction, i.e., in the direction of the Z-axis Z, against part of the housing 18 acting as a stop 14 by means of the clamping elements 8, which are driven by the SM elements 7K, and said element is held at the current adjustment position (clamped position).

The SM elements 7.1 to 7.4 consist of a magnetically controllable shape-memory material (MSM-SM elements).

A first coil 16.1 and a second coil 16.2 for producing a magnetic field are arranged surrounding the housing 18 in radial fashion. The orientations of the coils 16.1, 16.2 and an electric current flowing therethrough are chosen in such a way that the magnetic field lines MFL extend transversely to the occurring directed force effect F of the SM elements 7.1 to 7.4.

The SM elements 7.1 to 7.4 are actuated in contactless fashion by the effect of the magnetic field, in particular by the strength and direction thereof. Here, the actuation is implemented through the housing 18, and so there is no need for openings in a wall 13 of the housing 18.

Here, a person skilled in the art is aware that the magnetic field lines MFL of a magnetic field follow curved trajectories. A person skilled in the art understands the simplified description provided and selects the coils 16.1, 16.2 and the arrangement thereof in such a way that the aforementioned effect occurs on the SM elements 7.1 to 7.4 to an extent that can be sensibly used from a technical point of view.

In a further embodiment of the actuator 1 according to the invention and of the apparatus 3 according to the invention, the SM elements 7.1 to 7.3 (FIGS. 6a and 6b) are arranged in such a way that the force effect F thereof occurs coaxially in relation to the optical axis 4 in the direction of the Z-axis Z. The SM elements 7.1 to 7.3 consist of magnetically controllable shape-memory material (MSM-SM elements).

The two coils 16.1 and 16.2 are each arranged in planes parallel to the optical axis 4. The magnetic field lines MFL of the magnetic field produced or producible by the coils 16.1, 16.2 once again extend transversely to the force effect F of the SM elements 7.1 to 7.3, albeit now in the direction of the Y-axis Y and hence transversely to the optical axis 4.

The change in the dimensions brought about or able to be brought about in the SM elements 7.1 to 7.3 by means of the magnetic field, in particular the change in the length of the SM elements 7.1 to 7.3, can be used for adjusting the element 6 to be moved along the Z-axis Z. Additionally or alternatively, tilt movements of the element 6 to be moved can be produced about the X-axis X and/or about the Y-axis Y with the tilt angles $\varphi X$ and $\varphi Y$, respectively.

FIG. 7 illustrates a further embodiment of the actuator 1 and of the apparatus 3, which represents a modification of the embodiment described in relation to FIG. 6b.

Two elements 6 to be moved, which each hold an optical lens 20, are arranged in the housing 18 along the optical axis 4. Two SM elements 7.1, 7.2, the force effect F of which is directed parallel to the optical axis 4, are arranged between the elements 6 to be moved. The SM elements 7.1, 7.2 are arranged between the elements 6 to be moved, which are embodied as mounts, and supported on one of the elements 6 to be moved, while the SM elements 7.1, 7.2 are borne in the respective other element 6 to be moved.

The coils 16.1 and 16.2 are arranged in such a way that the magnetic field lines MFL of the magnetic fields produced by the coils 16.1, 16.2 extend transversely to the optical axis 4 and to the force effect F of the SM elements 7.1, 7.2.

The two elements 6 to be moved are adjustable relative to one another along the optical axis 4 by means of the actuator 1. The effect of the magnetic field or of the magnetic fields of the coils 16.1, 16.2 is appliable through the wall 13 of the housing 18.

One of the elements 6 to be moved is securely connected to the housing 18 while the other element 6 to be moved is displaceable along the optical axis 4. The SM elements 7.1, 7.2 are indirectly connected to the housing 18 acting as a carrier 5 via the element 6 to be moved that is securely connected to the housing 18.

A sixth exemplary embodiment of the actuator 1 according to the invention and a sixth exemplary embodiment of the apparatus 3 according to the invention is shown schematically in FIG. 8.

The illustrated arrangement 2 comprises an actuator 1 with an SM element 7, which protrudes into a first wall 13.1 of the housing 18.

A displacement path transversely to the optical axis 4 is delimited by the housing 18 and the walls 13.1, 13.2 thereof (only these two walls are shown) on its sides parallel to the optical axis 4.

A conductor 12 made of a magnetically conductive material has been introduced in U-shaped fashion into the first wall 13.1, wherein the conductor 12 extends in the first wall 13.1 over at least a portion of its length and the conductor 12 is connected to the SM element 7.1. Magnetic fluxes, symbolized by the magnetic field lines MFL, which are guided or guidable in the conductor 12 interact with the SM element 7.1 and cause the force effect F.

By way of example, the conductor 12 is part of a core of the coil 16.1 and it consists of a material with a good magnetic conductivity. By way of example, the conductor 12 is formed by an iron core or a core made of iron sheets.

In further embodiments of the arrangement 2 and apparatus 3 shown in relation to FIG. 8, the element 6 to be moved is connected to a plurality of SM elements 7.1 to 7.n.

These can additionally or alternatively facilitate an adjustment in the direction of the optical axis 4. Further, provision can be made of a clamping element 8 and an associated SM element 7K.

A further possible exemplary embodiment of the actuator 1 according to the invention and of the apparatus 3 according to the invention is illustrated in FIG. 9. The first and the second SM element 7.1, 7.2 are embodied for the lateral displacement and adjustment of the element 6 to be moved. In alternative embodiments, the SM element 7K embodied as a clamping element 8 can be replaced by a spring element 21. An SM element 7K and a spring element 21 are present in further embodiments. By way of example, a spring element 21 acts as a clamping element 8 transversely to the first SM element 7.1 and an SM element 7K acts transversely to the second SM element 7.1. Forces, in particular clamping forces, in the production of which at least one spring element 21 is involved or, depending on the embodiment alternative, can be involved, are also denoted as Fcoil below. The carrier 5 in each case surrounds one of the SM elements 7.1 or 7.2 and respectively one of the components of SM element 7K and/or spring element 21.

Advantages of such an embodiment lie in the possible reduction in the number of active SM elements. Spring forces Fcoil that are large enough to prevent a maladjustment of the element 6 to be moved in conjunction with occurring frictional forces are directed onto the element 6 to be moved by means of the spring element 21 or the spring elements 21. The SM elements 7.1, 7.2 are designed in such a way that these can develop a force effect F that can overcome the spring forces Fcoil and facilitate a precise and controllable adjustment of the element 6 to be moved.

If the clamping element 8 is realized by SM elements 7K, the produced or producible force effects Fcoil can also be greater than the producible force effects F of the first and the second SM element 7.1, 7.2.

A further embodiment of an apparatus 3 in the form of an optical system, for example a filling funnel, is shown in FIG. 10 and realized by virtue of four actuators 1 of the exemplary embodiment described in relation to FIG. 9 being stacked one above the other along the optical axis 4 in a housing 18. Clear space 15 is present between the optical lenses 20 in each case. The actuators 1 arranged in such a stacked fashion are displaceable and adjustable transversely to the optical axis 4. Different numbers of actuators 1, for example two, three or five, may be present in further embodiments of the apparatus 3.

In further embodiments of the apparatus 3, the actuators 1 present are adjustable in mutually different directions X, Y and/or Z.

Further, actuators 1 according to the invention can be combined with stationary installed components, for example optical lenses, stops and/or filters.

In a modification of the apparatus 3 illustrated in FIG. 11, four actuators 1 of the exemplary embodiment described in relation to FIG. 9 are stacked one above the other along the optical axis 4. Transversely to the optical axis 4 and facing away from the latter, each of the carriers 5 has an extended wall region 5.1 (active alignment stack mount). The actuators 1 arranged adjacent to extended wall regions 5.1 abut one another and are connected to one another, preferably in detachable fashion, by means of respectively one fastening means that is illustrated schematically here. The apparatus realized thereby represents an optical system made of a plurality of active alignment stack mounts.

FIG. 12 illustrates a further possible embodiment of an actuator 1 and an apparatus 3, wherein the first and second SM element 7.1, 7.2 are arranged opposite one another on the element 6 to be moved. The effect direction, i.e., the direction in which the force effect F of the first and second SM elements 7.1, 7.2 occurs, extends parallel to the optical axis 4. The SM element 7K is arranged transversely to the optical axis 4, the clamping effect of which—the associated clamping force is denoted Fcoil—is directed orthogonal to the optical axis 4. As a consequence of an actioned and sufficiently large clamping force Fcoil, the element 6 to be moved is pressed against the part of the carrier 5 lying opposite the SM elements 7.1, 7.2 and 7K.

The use of an actuator 1 described in relation to FIG. 12 is shown in FIG. 13 in the form of an apparatus 3 comprising an arrangement 2, which is embodied as an optical system, for example an objective 19. On a wall 13, for example of a housing 18, acting as a common base, an actuator 1 as described in relation to FIG. 9 and an actuator 1 as described in relation to FIG. 12 are respectively arranged in alternating fashion along the optical axis 4. Depending on the embodiment of the actuator 1, the optical lenses 20 of the individual actuators 1 are adjustable transversely to, or in the direction of, the optical axis 4.

The exemplary embodiment of the apparatus 3 and the actuator 1 according to FIG. 14 corresponds, in terms of its basic design, to the embodiment option described in relation to FIG. 9, where the clamping elements 8 are formed by spring elements 21. The SM elements 7.1 and 7.2 consist of magnetically controllable shape-memory material (MSM-SM elements). A first coil 161 and a second coil 16.2 for producing a magnetic field are arranged surrounding the housing 18 in radial fashion. The orientations of the coils 16.1, 16.2 and an electric current flowing therethrough are chosen in such a way that the magnetic field lines MFL extend transversely to the occurring directed force effect F of the SM elements 7.1 to 7.4.

The SM elements 7.1 to 7.4 are actuated in contactless fashion by the effect of the magnetic field, in particular by the strength and direction thereof. Here, the actuation is implemented through the housing 18, and so there is no need for openings in a wall 13 of the housing 18.

FIGS. 15a and 15b schematically illustrate an exemplary embodiment of an apparatus 3 for a 5-dimensional adjustment. In addition to SM elements 7.1 to 7.3 acting laterally, i.e., transversely, to the optical axis 4, three further SM elements 7.4 to 7.6, which act parallel to the optical axis 4, are present in the plan view of FIG. 15a.

As may be gathered from the schematic side view of FIG. 15b, the laterally acting SM elements 7.1 to 7.3—only the SM element 7.1 can be seen as a consequence of the sectional illustration develop a force effect F orthogonal to the optical axis 4. By means of the further SM elements 7.4 to 7.6, the element 6 to be moved with the optical lens 20 is displaceable along the optical axis 4 and can be additionally tilted through a tilt angle $\varphi X$ about the X-axis X and/or through a tilt angle $\varphi Y$ about the Y-axis Y.

FIG. 16 illustrates a positioning system in which the element 6 to be moved has magnets 22 on its side facing the carrier 5. The carrier 5 consists of a magnetic material, and so the element 6 to be moved and the carrier 5 are connected to one another by a magnetic force Fmag between the magnets 22 and the carrier 5. The element 6 to be moved and the carrier 5 contact along a contact face 23, while the magnets 22 are not in direct contact with the carrier 5. The current position of the element 6 to be moved can be captured by means of sensors 11, the measured values of which are evaluated by the evaluation unit 9 and transmitted to the control unit 10. Depending on the data provided by the evaluation unit 9, the control unit 10 produces and issues control commands that serve to actuate the SM elements 7. The SM elements 7, 7.1, 7.2 can be arranged between the carrier 5 and the element 6 to be moved.

In further embodiments, the SM elements 7 can also be embodied as wires or strips and act on the element 6 to be moved from a radial direction, i.e., substantially transversely to the optical axis 4 (FIG. 17). Here, the SM elements 7.1, 7.2 embodied as strips are hinged on the carrier 5 and actuatable by means of the control unit 10. The SM elements 7.1, 7.2 act on the element 6 to be moved via a respective projection 6.1 of the latter. Depending on the change in the length of the respective SM elements 7.1, 7.2, the element 6 to be moved and the optical lens 20 are displaced substantially in a plane orthogonal to the optical axis 4 (symbolized by the double-headed arrow).

Further SM elements 7, which facilitate an actuating movement of the element 6 to be moved in an XY-plane, can be present in further embodiments of the apparatus. An option consists of a further arrangement like the one shown in FIG. 17 being present along the optical axis 4, said further arrangement however being arranged rotated through an angle, for example through 90°, in relation to the first arrangement. In this way, the element 6 to be moved and the optical lens 20 can be adjusted substantially along the X-axis X by one of the arrangements and substantially along the Y-axis Y by the other arrangement. The interaction of at least two such arrangements that are rotated in relation to one another facilitates a free positionability of the element 6 to be moved in the XY-plane within the scope of the respectively realizable travels.

It is also possible for three, four or more SM elements 7 to be arranged in a plane, the element 6 to be moved being adjustable in the XY-plane by the interaction thereof.

Further, it is possible for SM elements 7 to be arranged in arrangements in different planes along the optical axis 4 (in the direction of the Z-axis Z).

Positioning is implemented as described above by means of sensors 11 (not shown), evaluation unit 9 and control unit 10.

FIG. 18 schematically shows an exemplary embodiment of the invention that is embodied as a positioning system. Induction coils are arranged as sensors 11 on the carrier 5, in each case at an angle of 120° in relation to one another. At least a portion of the material of the element 6 to be moved consists of an electrically conductive material, and so a current position (actual position) of the element 6 to be moved is establishable by means of the sensors 11. This current position can be described by the respective distances D between each sensor 11 and the element 6 to be moved. The distances D are elucidated symbolically by double-headed arrows.

If there is a change in at least one of the distances D, there is also a change in the inductances and/or the captured impedances at the respective sensors 11. These changes are transmitted to, and converted by, an inductance-to-digital converter 24 before the converted data are transmitted to the evaluation unit 9. An actuation of the SM elements 7, 7.1, 7.2, 7.3 depending on the data transmitted by the evaluation unit is possible by means of the control unit 10. A determined deviation of the current position of the element 6 to be moved from a desired position (intended position) can be compensated by an appropriate actuation of the SM elements 7, 7.1, 7.2, 7.3.

REFERENCE SIGNS

1 Actuator
2 Optical arrangement
3 Apparatus
4 Optical axis
5 Carrier
5.1 Extended wall region (of the carrier 5)
6 Element to be moved
6.1 Projection
7 SM element
7.1 First SM element
7.2 Second SM element
7.3 Third SM element
7.4 Fourth SM element
7K SM element (of the clamping element 8)
8 Clamping element
9 Evaluation unit
10 Control unit
11 Measuring circuit/sensor
12 Conductor
13 Wall
13.1 Wall
13.2 Wall
14 Stop
15 Clear space
16.1 First coil
16.2 Second coil
17 Mount
18 Housing/tube
19 Objective
20 Optical lens
21 Spring element
22 Magnet
23 Contact face
24 Inductance-to-digital converter
MFL Magnetic field lines
D Distance
F Force effect
Fcoil Force effect (of the spring element 21)
Fmag Magnetic force
X X-axis
Y Y-axis
Z Z-axis
XY XY-plane
XZ XZ-plane
YZ YZ-plane
$\varphi X$ Tilt angle (about the X-axis X)
$\varphi Y$ Tilt angle (about the Y-axis Y)

The invention claimed is:

1. An actuator for adjusting an element to be moved along a displacement path, said actuator comprising:
   the element to be moved,
   a carrier,
   at least one clamping element, and
   a first shape-memory (SM) element,
   wherein the first shape-memory element is connected to the element to be moved and embodied so as to be supported on the carrier such that a directed force effect is produced between the element to be moved and the carrier in case of a change in an extent of the first shape-memory element, and wherein the at least one clamping element is configured to apply a force to clamp the element in a fixed position relative to the carrier after the directed force effect moves the element to a clamped position.

2. The actuator as claimed in claim 1, wherein the at least one clamping element comprises a second SM element, a force effect of said second SM element being directed on the element to be moved and the element to be moved being clamped against an abutment as a result of said force effect of said second SM element such that the clamped element to be moved is held in the clamped position.

3. The actuator as claimed in claim 2, wherein at least one of the first or second SM elements comprises a magnetic shape-memory material.

4. The actuator as claimed in claim 3, wherein at least one coil is arranged in such a way to produce a magnetic field comprising magnetic field lines that extend transversely to the directed force effect of at least one of the first or second SM element comprising magnetic shape-memory material.

5. The actuator as claimed in claim 1, wherein the element to be moved and/or the carrier has at least one magnet and the element to be moved lying opposite the magnet or the carrier comprises at least partly a magnetic material or opposing magnets attract one another such that a magnetic force acts between the element to be moved and the carrier, and the element to be moved and the carrier attract one another.

6. An arrangement, comprising:
an actuator as claimed in claim 1,
a wall comprising at least one side delimiting movement of the element along the displacement path, and
a conductor comprising a magnetically conductive material,
wherein the conductor, over at least a portion of its length, extends in the wall and the conductor is connected to at least one of the first and/or second SM elements in such a way that magnetic field lines guided in the conductor interact with the first and/or second SM element.

7. An optical apparatus, comprising:
an actuator as claimed in claim 1.

8. The optical apparatus as claimed in claim 7 which is in the form of an objective.

9. An apparatus for adjusting an element to be moved, said apparatus comprising:
at least one actuator as claimed in claim 1, and
an evaluation unit configured to evaluate current spatial coordinates, and
a control unit configured to generate control commands depending on the evaluated current spatial coordinates.

10. The apparatus as claimed in claim 9, wherein the evaluation unit and/or the control unit are configured to generate the control commands on the basis of calculation prescriptions depending on incoming measured values of operating parameters and/or depending on selectable modes of operation of the apparatus.

11. The apparatus as claimed in claim 9, wherein the evaluation unit and/or the control unit is connected to at least one further component via a data link and the control unit is configured to generate the control commands depending on received data from the at least one further component.

12. The apparatus as claimed in claim 9, further comprising at least one sensor, embodied as an induction sensor, between carrier and element to be moved, and an inductance-to-digital converter configured to digitize measured values captured by the at least one sensor.

13. A method for moving a component of an objective into position, said method comprising:
adjusting a position of said component of said objective with an actuator as claimed in claim 1.

14. A method for adjusting a stop, a reflecting element and/or a sensor in a beam path of an optical apparatus, said method comprising:
adjusting a position of said stop, said reflecting element and/or said sensor in said beam path of said optical apparatus with an actuator as claimed in claim 1.

15. A method for adjusting at least two optical elements relative to one another, said method comprising:
adjusting a position of said at least two optical elements relative to one another with an actuator as claimed in claim 1.

16. An optical apparatus, comprising:
an arrangement as claimed in claim 6.

17. The optical apparatus as claimed in claim 16 which is in the form of an objective.

18. A method for moving a component of an objective into position, said method comprising:
adjusting a position of said component of said objective with an arrangement as claimed in claim 6.

19. A method for adjusting a stop, a reflecting element and/or a sensor in a beam path of an optical apparatus, said method comprising:
adjusting a position of said stop, said reflecting element and/or said sensor in said beam path of said optical apparatus with an arrangement as claimed in claim 6.

20. A method for adjusting at least two optical elements relative to one another, said method comprising:
adjusting a position of said at least two optical elements relative to one another with an arrangement as claimed in claim 6.

* * * * *

UNITED STATES PATENT AND TRADEMARK OFFICE
CERTIFICATE OF CORRECTION

| | | |
|---|---|---|
| PATENT NO. | : 11,016,261 B2 | Page 1 of 1 |
| APPLICATION NO. | : 16/334910 | |
| DATED | : May 25, 2021 | |
| INVENTOR(S) | : Benjamin John and Michael Schulz | |

It is certified that error appears in the above-identified patent and that said Letters Patent is hereby corrected as shown below:

On the Title Page

Under References Cited, a U.S. reference has been omitted as follows:
-- 7,057,746 6/2006 Binning et al. --;

On page two under Foreign Patent Documents, a reference currently reads:
"DE 9696518 6/2013"
And should read:
-- DE 10 2012 202 170 6/2013 --; and In the Specification Column 18, Line 29 of the description currently reads:
"A first coil 161 and a second coil 16.2 for..."
And should read:
-- A first coil 16.1 and a second coil 16.2 for... --.

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*